US006956605B1

(12) United States Patent
Hashimoto

(10) Patent No.: US 6,956,605 B1
(45) Date of Patent: Oct. 18, 2005

(54) IMAGE PICKUP APPARATUS

(75) Inventor: Seiji Hashimoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/368,496

(22) Filed: Aug. 5, 1999

(30) Foreign Application Priority Data

Aug. 5, 1998 (JP) ................................ 10-221680
Aug. 5, 1998 (JP) ................................ 10-221681

(51) Int. Cl.[7] ......................... H04N 3/14; H04N 5/335; H04N 9/083; H01L 27/00

(52) U.S. Cl. ...................... 348/301; 348/308; 348/273; 250/208.1

(58) Field of Search ................................ 348/300, 301, 348/302, 303, 304, 305, 306, 307, 308, 294, 348/315, 316, 319, 321, 323, 273, 280; 250/208.1

(56) References Cited

U.S. PATENT DOCUMENTS

| | | | | |
|---|---|---|---|---|
| 4,768,085 A | | 8/1988 | Hashimoto | 358/48 |
| 4,876,601 A | | 10/1989 | Hashimoto et al. | 358/213.26 |
| 4,910,597 A | | 3/1990 | Harada et al. | 358/213.15 |
| 4,910,599 A | | 3/1990 | Hashimoto | 358/213.26 |
| 4,914,519 A | | 4/1990 | Hashimoto et al. | 358/213.18 |
| 4,967,067 A | | 10/1990 | Hashimoto et al. | 250/208.1 |
| 4,985,758 A | | 1/1991 | Hashimoto | 358/44 |
| 5,162,912 A | | 11/1992 | Ueno et al. | 358/213.16 |
| 5,262,850 A | | 11/1993 | Hashimoto | 358/500 |
| 5,288,988 A | | 2/1994 | Hashimoto et al. | 250/208.1 |
| 5,315,412 A | | 5/1994 | Mihara et al. | 358/412 |
| 5,418,387 A | | 5/1995 | Nakamura et al. | |
| 5,424,529 A | | 6/1995 | Hashimoto et al. | 250/208.1 |
| 5,587,814 A | | 12/1996 | Mihara et al. | 358/512 |
| 5,742,059 A | * | 4/1998 | Hassler | 348/302 |
| 5,856,686 A | * | 1/1999 | Watanabe et al. | 250/208.1 |
| 5,896,173 A | * | 4/1999 | Hassler | 348/302 |
| 5,955,753 A | | 9/1999 | Takahashi | |
| 6,104,844 A | * | 8/2000 | Alger-Meunier | 382/312 |
| 6,107,655 A | * | 8/2000 | Guidash | 257/233 |
| 6,300,977 B1 | * | 10/2001 | Waechter et al. | 348/300 |
| 6,365,950 B1 | * | 4/2002 | Sohn | 250/208.1 |
| 6,452,153 B1 | * | 9/2002 | Lauxtermann et al. | 348/302 |
| 6,466,265 B1 | * | 10/2002 | Lee et al. | 348/308 |
| 6,657,665 B1 | * | 12/2003 | Guidash | 348/308 |
| 6,693,670 B1 | * | 2/2004 | Stark | 348/308 |
| 6,734,906 B1 | * | 5/2004 | Hashimoto | 348/302 |
| 6,794,627 B2 | * | 9/2004 | Lyon et al. | 348/308 |
| 2004/0252215 A1 | * | 12/2004 | Mori | 348/308 |

FOREIGN PATENT DOCUMENTS

| | | | | |
|---|---|---|---|---|
| JP | 63-100879 | | 5/1988 | |
| JP | 04-000461 | | 1/1992 | |
| JP | 09-046596 | | 2/1997 | |
| JP | 11126895 A | * | 5/1999 | H01L 27/146 |
| WO | WO A 97 07630 | | 2/1997 | |

* cited by examiner

*Primary Examiner*—Wendy R. Garber
*Assistant Examiner*—John M. Villecco
(74) *Attorney, Agent, or Firm*—Fitzpatrick, Cella, Harper & Scinto

(57) ABSTRACT

To provide an image pickup apparatus capable of adding signals from a plurality of photoelectric conversion portions, an image pickup apparatus including a plurality of unit cells arranged in an array, each unit cell including a plurality of photoelectric conversion portions and a common circuit for inputting signals from the plurality of photoelectric conversion portions and outputting the signals from the unit cell, a first addition circuit for adding the signals from the plurality of photoelectric conversion portions in the unit cell, and a second addition circuit for adding the signals from the plurality of photoelectric conversion portions outside the unit cell is provided.

5 Claims, 22 Drawing Sheets

IMAGE PICKUP APPARATUS

BACKGROUND OF THE INVENTION

1. Field of the Invention

The present invention relates to an image pickup apparatus and an image pickup system using the same and, more particularly, to an image pickup apparatus in which a plurality of photoelectric conversion portions are arranged in a common circuit and an image pickup system using this apparatus.

2. Related Background Art

Digital broadcasting has started in the U.S.A in 1998. In 2006, NTSC broadcasting (525V) will be obsolete and TV broadcasting will completely shift to HD digital. In addition, digital cameras with 1,300,000 pixels are sweeping over the market. This means that there is a demand for outputting high- and low-resolution signals from a high pixel count sensor as needed.

Under these circumstances, the pixel size in CCDs is shrinking (reducing). However, a CCD with a side of about 5 μm is incapable of high-speed read. CCDs currently commercially available have only 600,000 pixels and a read rate of about 60 frame/sec.

CMOS sensors manufactured by the same process as the CMOS manufacturing process allow random access and have been expected as sensors suitable for higher-speed operation in the future.

When a small number of pixels are to be read out from a high pixel count sensor, low pixel count information can be obtained by interlaced scanning. In this interlaced scanning, (1) A CCD discards pixel signals of unnecessary horizontal lines to an overflow drain provided in a horizontal shift register. Additionally, of signals read out from the CCD, only necessary signals are sampled.

(2) A CMOS sensor outputs only necessary signals by random access.

However, interlaced scanning (1) of the CCD requires excess power to transfer charges of unnecessary pixels. In addition, since unnecessary signals are discarded by decimation, moiré due to low sampling rate occurs. Interlaced scanning (2) also generates moiré.

SUMMARY OF THE INVENTION

It is an object of the present invention to provide an image pickup apparatus capable of adding signals from a plurality of photoelectric conversion portions.

In order to achieve the above object, according to an aspect of the present invention, there is provided an image pickup apparatus comprising a plurality of unit cells arranged in an array, each unit cell including a plurality of photoelectric conversion portions and a common circuit for inputting signals from the plurality of photoelectric conversion portions and outputting the signals from the unit cell, first addition means for adding the signals from the plurality of photoelectric conversion portions in the unit cell, and second addition means for adding the signals from the plurality of photoelectric conversion portions outside the unit cell.

According to another aspect of the present invention, there is provided an image pickup apparatus comprising a plurality of unit cells arranged in an array, each unit cell including a plurality of photoelectric conversion portions and a common circuit for inputting signals from the plurality of photoelectric conversion portions and outputting the signals from the unit cell, and addition means for adding the signals from the plurality of photoelectric conversion portions for outputting signals of the same color outside the unit cell.

According to still another aspect of the present invention, there is provided an image pickup apparatus comprising a plurality of unit cells arranged in an array, each unit cell including a plurality of photoelectric conversion portions and a common circuit for inputting signals from the plurality of photoelectric conversion portions and outputting the signals from the unit cell, and addition switching means for arbitrarily switching the signals from the photoelectric conversion portions, which are to be added in the cell.

The other objects, features, and advantages will become apparent from the following specification in conjunction of the drawings.

DESCRIPTION OF THE PREFERRED EMBODIMENTS

Before a description of the embodiments, the difference between the present invention and prior art will be described.

When the image of a dark object is to be picked up, a current CMOS sensor adds signals of two vertical pixels. For example, in FIG. 4 of Japanese Patent Application Laid-open No. 9-46596, signals of two photoelectric conversion portions in the vertical direction are added in a cell at the same time. However, there is neither disclosure about addition of signals from photoelectric conversion portions in the horizontal direction nor disclosure about addition of signals from photoelectric conversion portions in the vertical or oblique direction by a horizontal transfer means. Also, there is no disclosure about addition and read of signals of the same color in adding and reading out color signals.

An arrangement in which one amplification means is prepared for the photoelectric conversion portions of a vertical array of two or three or more pixels is disclosed in Japanese Patent Application Laid-open No. 4-461. An arrangement in which one amplification means is prepared for the photoelectric conversion portions of four pixels in the horizontal and vertical directions is disclosed in Japanese Patent Application Laid-open No. 63-100879. Both prior arts have no disclosure about addition processing.

Figure 1:
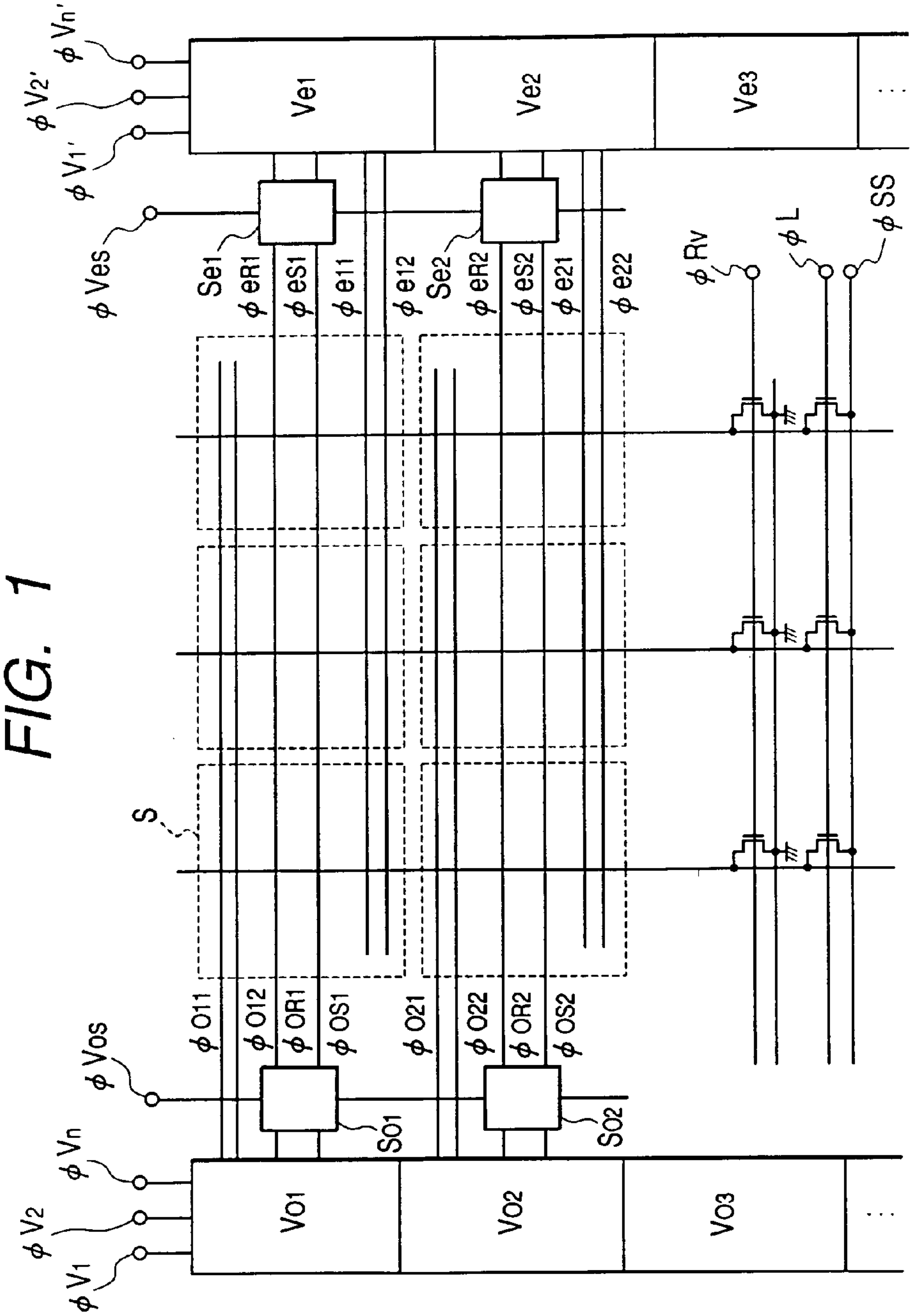
FIG. 1 is a schematic view showing the arrangement of part of an image pickup apparatus according to the first embodiment.
Figure 2:
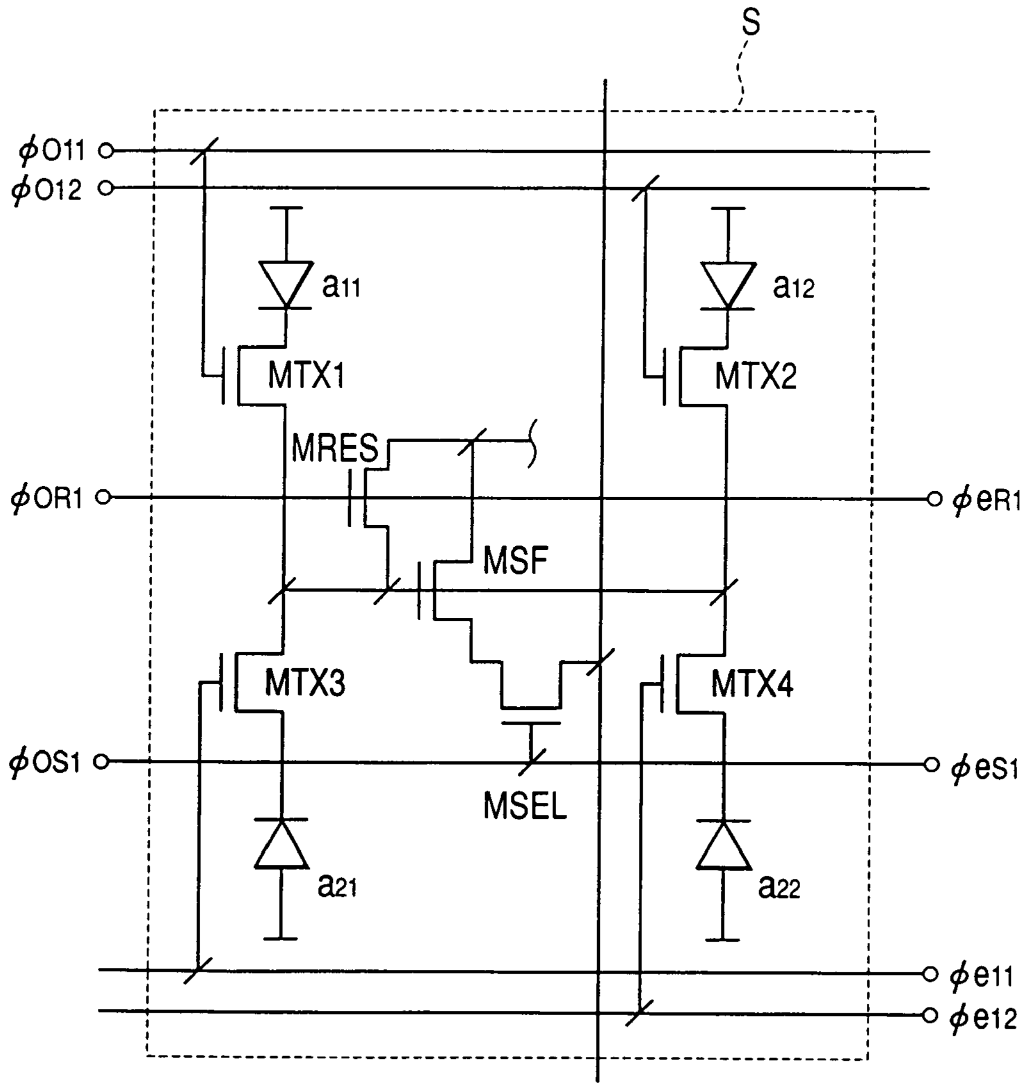
FIG. 2 is a view showing the arrangement of a unit cell S of the image pickup apparatus shown in FIG. 1 or 10.

FIG. 1 is a schematic view showing the arrangement of part of an image pickup apparatus according to the first embodiment of the present invention. FIG. 2 is a view showing the arrangement of a unit cell S of the image pickup apparatus shown in FIG. 1.

As shown in FIG. 2, the unit cell S is formed by arranging four photoelectric conversion portions ($a_{11}$, $a_{12}$, $a_{21}$, and $a_{22}$) for one common amplifier. The remaining unit cells have the same arrangement as that of the unit cell. The common amplifier comprises an amplification means MSF, reset means MRES, and select means MSEL. The input portion of the common amplifier corresponds to the gate portion of the amplification means MSF.

Lines for controlling signal transfer for two upper photoelectric conversion portions ($a_{11}$ and $a_{12}$) of the four pixels, that are adjacent to each other in the horizontal direction are connected to an odd vertical shift register $V_o$ ($V_{o1}$, $V_{o2}$, $V_{o3}$ . . . ). Lines for controlling signal transfer for two lower photoelectric conversion portions ($a_{21}$ and $a_{22}$) that are adjacent to each other in the horizontal direction are connected to an even-numbered vertical shift register $V_e$ ($V_{e1}$, $V_{e2}$, $V_{e3}$, . . . ). The reset switch MRES and select switch MSEL of the common amplifier are connected to the corresponding vertical shift registers $V_o$ and $V_e$ through an odd selection circuit $S_o$ and an even selection circuit $S_e$, respectively. The vertical shift registers $V_o$ and $V_e$ and selection circuits $S_o$ and $S_e$ can be independently controlled.

Figure 3A:
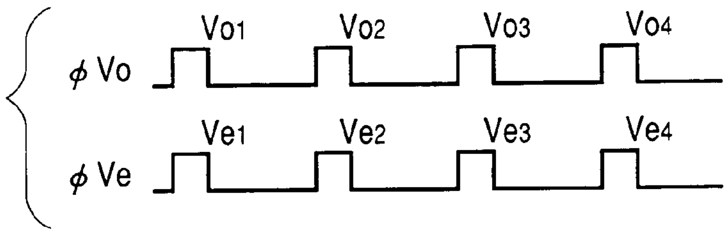
FIGS. 3A and 3B are timing charts of a vertical shift register in interlaced scanning.
Figure 3B:
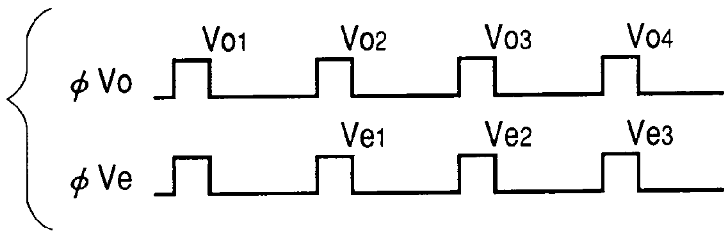

FIGS. 3A and 3B are timing charts of the vertical shift register in interlaced scanning. FIG. 3A is a timing chart of odd fields. FIG. 3B is a timing chart of even fields.

Referring to FIG. 3A, horizontal scanning is performed in units of two lines connected to a common amplifier. More specifically, vertical shift registers $V_{on}$ of odd rows and vertical shift registers $V_{en}$ of even rows are simultaneously controlled. The high-level period of signals $\phi_o$ and $\phi_e$ corresponds to the horizontal blanking period in which the sensor read and reset operations are performed.

Referring to FIG. 3B, pixels of two lines connected to common amplifiers, which are adjacent to each other between the common amplifiers are selected and horizontally scanned. More specifically, the cell numbers are shifted by one with respect to FIG. 3A, and a combination of a vertical shift register $V_{on+1}$ and vertical shift register $V_{en}$ and a combination of a vertical shift register $V_{on+2}$ and vertical shift register $V_{en+1}$ are driven.

Figure 4:
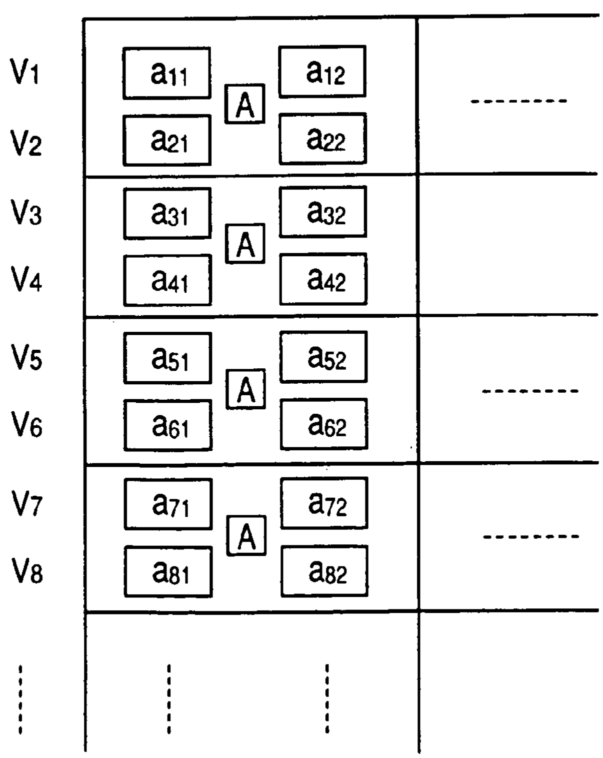
FIG. 4 is a view showing unit cells of the image pickup apparatus.

In the above interlaced scanning, when pixel signals are to be added, and signals from a plurality of photoelectric conversion portions in one unit cell are to be added, the input portion of one common amplifier can add the signals. However, when signals from a plurality of photoelectric conversion portions in different unit cells are to be added, the signals cannot be added by the input portion of one common amplifier. This will be described with reference to FIG. 4 showing the unit cells of the image pickup apparatus. For addition in the same unit cell, for example, signals from horizontal arrays of photoelectric conversion portions ($a_{11}+a_{12}$, $a_{21}+a_{22}$, $a_{31}+a_{32}$, . . . ), signals vertical arrays of from photoelectric conversion portions ($a_{11}+a_{21}$, $a_{31}+a_{41}$, . . . ), or signals from oblique arrays of photoelectric conversion portions ($a_{11}+a_{22}$, $a_{31}+a_{42}$, . . . or $a_{12}+a_{21}$, $a_{32}+a_{41}$, . . . ) can be added by the same common amplifier A and read out from the unit cell. However, for addition between different unit cells, for example, signals from vertical arrays of photoelectric conversion portions ($a_{21}+a_{31}$, $a_{41}+a_{51}$ . . . ), or signals from oblique arrays of photoelectric conversion portions ($a_{21}+a_{32}$, $a_{41}+a_{52}$, . . . or $a_{22}+a_{31}$, $a_{42}+a_{51}$, . . . ) cannot be added by the same common amplifier A and read out from the unit cell.

In this embodiment, when an image pickup apparatus which has an array of a plurality of unit cells each having a plurality of photoelectric conversion portions and a common amplifier for receiving signals from the photoelectric conversion portions includes a mode for adding signals from a plurality of photoelectric conversion portions in different unit cells, signals from a vertical or oblique array of photoelectric conversion portions are added using a horizontal transfer means.

An embodiment of the present invention will be described below in detail.

Figure 5:
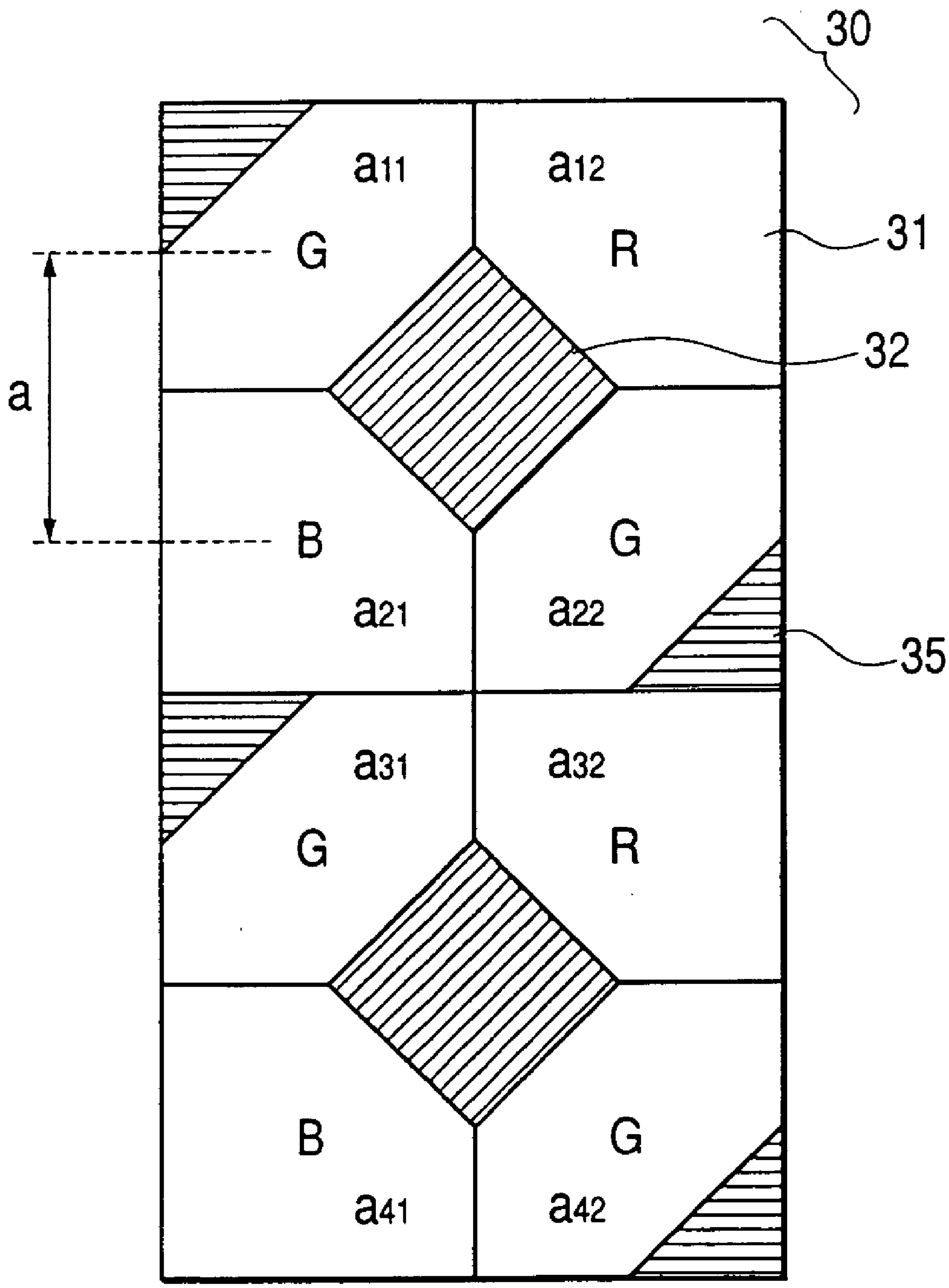
FIG. 5 is a view showing unit cells having a color filter with G pixels laid out in a checkerboard pattern.

Color separation using a color sensor will be described first. FIG. 5 shows unit cells having a color filter in which G pixels are laid out in a checkerboard pattern.

As shown in FIG. 5, in each of repeated unit cells 30 each comprised of four pixels, G (green) pixels that most influence the resolution are located at the upper left and lower right. Each G pixel has a light-shielding portion 35 at a position line-symmetric with respect to the area of a common amplifier portion 32 at the center of the unit cell 30. Hence, the center of gravity of a photoelectric conversion portion 31 of the G pixel is present at the center of the G pixel. Photoelectric conversion portions $a_{11}$ and $a_{22}$ of the G pixels line up at an equal interval a in the vertical and horizontal directions. An R (red) pixel is located at the upper right of each unit cell 30, and a B (blue) pixel is at the lower left of the unit cell 30. These pixels have no particularly designed light-shielding portion, unlike the G pixels, and line up at an equal interval corresponding to an interval 2$a$ of the unit cells 30 because each unit cell 30 has one R pixel and one B pixel.

Figure 6:
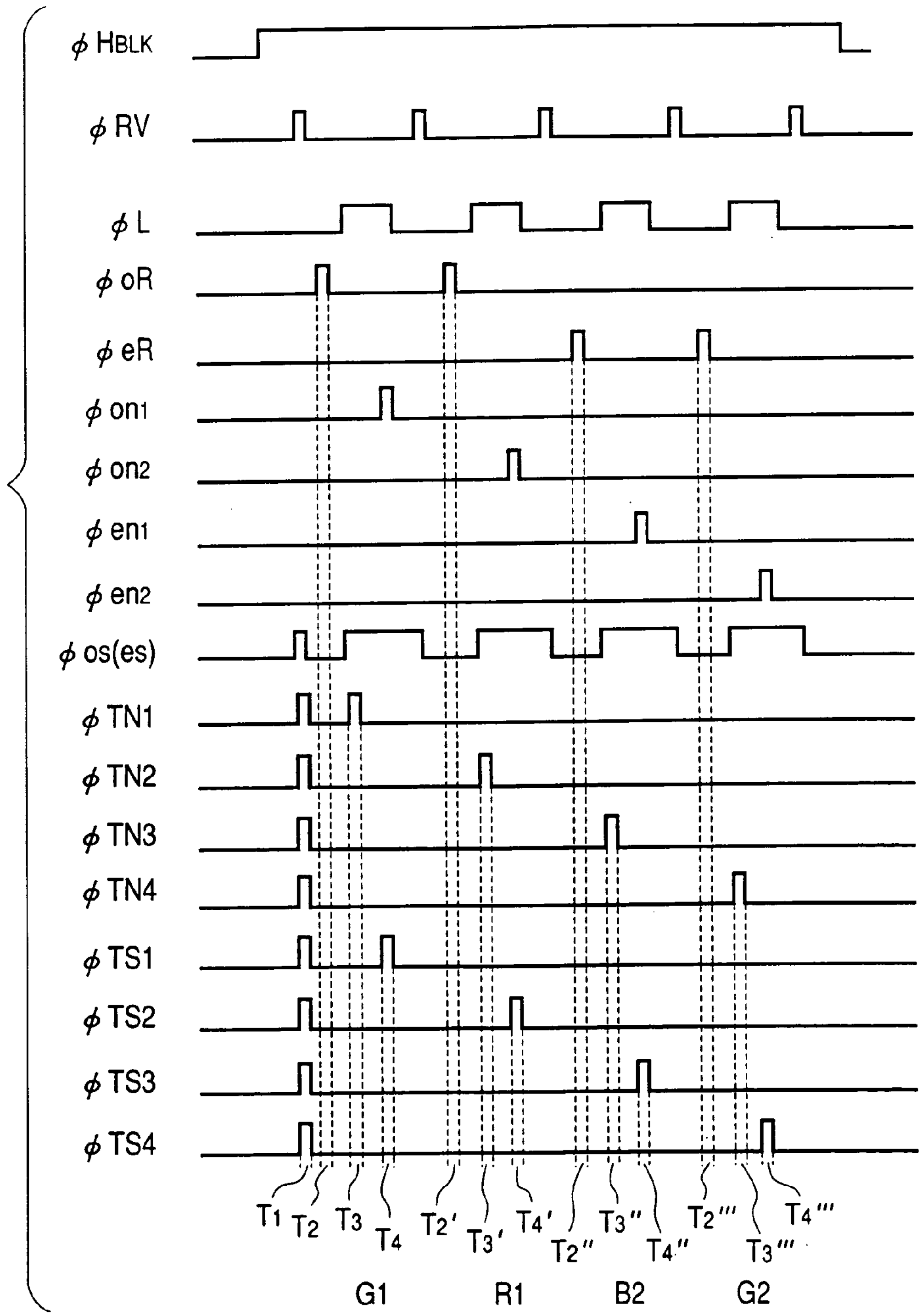
FIG. 6 is a timing chart showing color signal read using a color filter in which G pixels are laid out in a checkerboard pattern and R and B pixels are line-sequentially laid out.
Figure 7:
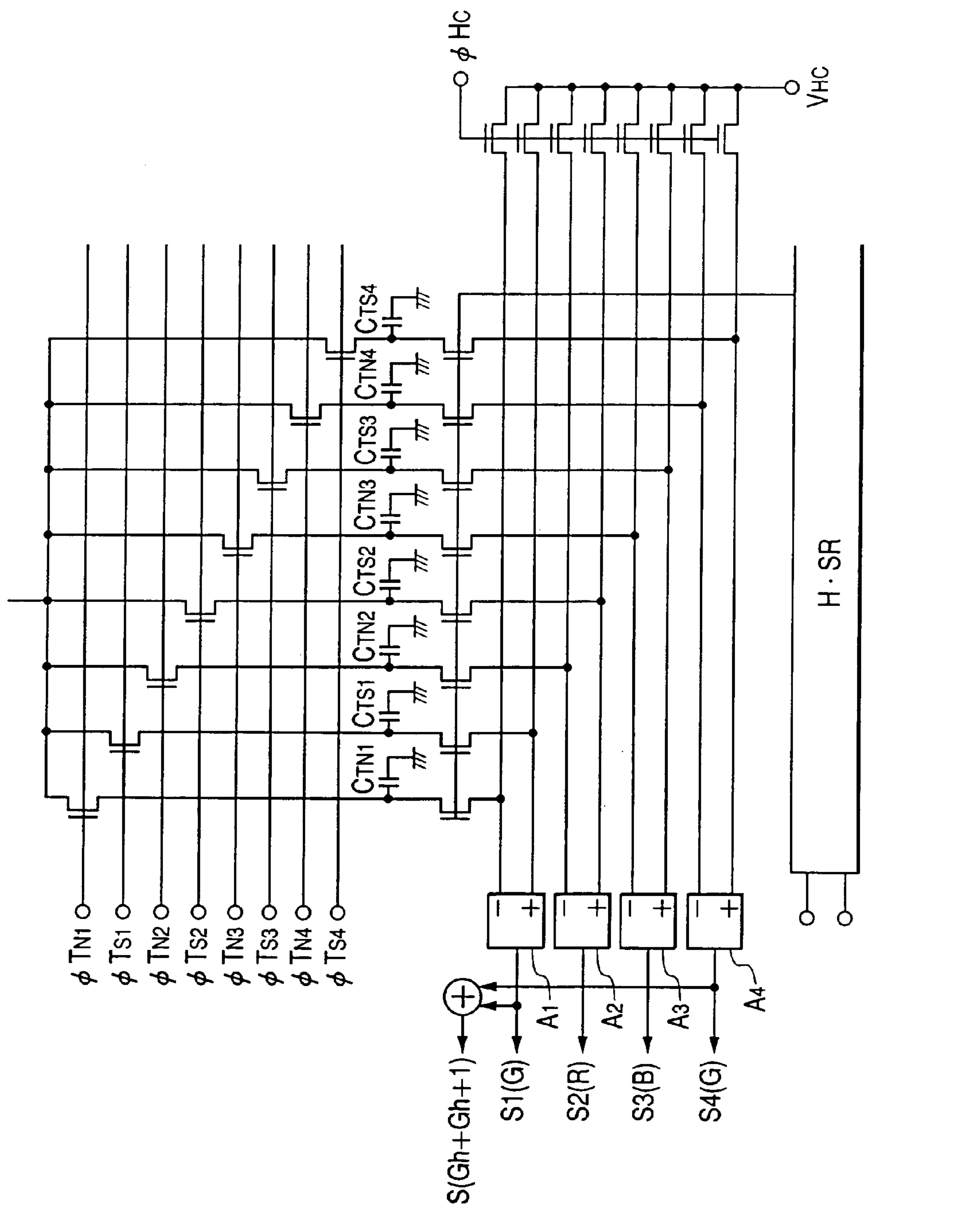
FIG. 7 is a circuit diagram of a signal read circuit for adding signals of the same color.

FIG. 6 is a timing chart showing color signal read using a color filter in which G pixels are laid out in a checkerboard pattern and R and B pixels are line-sequentially laid out. FIG. 7 is a circuit diagram for reading color signals. FIG. 7 also shows an addition means for adding signals of the same color in a low pixel count signal read (to be described later).

Referring to FIG. 6, in a period $T_1$, the vertical signal line is reset by a pulse $\phi_{RV}$ to remove residual charges on the signal line. Simultaneously, the residual charges on temporary storage capacitances $C_{TN1}$, $C_{TN2}$, $C_{TN3}$, $C_{TN4}$, $C_{TS1}$, $C_{TS2}$, $C_{TS3}$, and $C_{TS4}$ are removed by pulses $\phi_{TN1}$, $\phi_{TN2}$, $\phi_{TN3}$, $\phi_{TN4}$, $\phi_{TS1}$, $\phi_{TS2}$, $\phi_{TS3}$, and $\phi_{TS4}$, respectively.

In a period $T_2$, as preprocessing for transfer of photoelectric conversion signals of $G_1$ pixels (G pixel at the upper left in FIG. 5) in the photoelectric conversion portions ($a_{11}$, $a_{12}$, . . . , $a_{1n}$) of the first row, the gate portion (input portion) of the amplification means MSF of each common amplifier is reset by a pulse $\phi_{oR}$ to remove residual charges. After removal, reset noise remains in the gate portion.

In a period $T_3$, the reset noise and the offset voltage of the common amplifier in the period $T_2$ are transferred to the capacitance $C_{TN1}$. The output portion of each common amplifier is connected to the vertical signal line in accordance with a pulse $\phi_{oS}$, a load MOS transistor is turned on in accordance with a pulse $\phi_L$ to operate the common amplifier, and the vertical signal line and capacitance $C_{TN1}$ are connected in accordance with the pulse $\phi_{TN1}$. Noise ($N_1$) is stored in the capacitance $C_{TN1}$.

In a period $T_4$, photoelectric conversion signals from the photoelectric conversion portions of the $G_1$ pixels ($a_{11}$, $a_{12}$, . . . , $a_{1n}$) are transferred to the capacitance $C_{TS1}$. Portions from the common amplifier to the capacitance $C_{TS1}$ are turned on by the pulses $\phi_L$, $\phi_{TS1}$, and $\phi_{oS}$.

In accordance with a pulse $\phi_{o11}$, the photoelectric conversion signals are transferred from the photoelectric conversion portions to the gate portion of the common amplifier. At this time point, the photoelectric conversion signals are added to the reset noise in the period $T_2$ at the gate. This gate voltage is superposed on the offset voltage of the common amplifier and stored in the capacitance $C_{TS1}$ as a signal ($S_1+N_1$).

After this, the vertical signal line is reset by the pulse $\phi_{RV}$ to remove residual charges on the signal line. In a period $T_2'$, the gate portions are reset. In a period $T_3'$, noise ($N_2$) of the common amplifiers is transferred. In a period $T_4'$, signals ($S_2+N_2$) from $R_1$ pixels are transferred. In a similar manner, in periods $T_3''$, and $T_3'''$, noise of the common amplifiers is transferred. In periods $T_4''$ and $T_4'''$, signals ($S_3+N_3$) from $B_2$ pixels and signals ($S_4+N_4$) from $G_2$ pixels (G pixel at the lower right in FIG. 5), to which noise is added, are transferred. A differential amplifier removes noise from the color signals, so signals $S_1$(G), $S_2$(R), $S_3$(B), and $S_4$(G) are output.

The interlaced scanning operation in odd fields have been described above. As described with reference to FIGS. 3A and 3B, the operation in even fields can be realized by changing the combinations of the vertical shift registers $V_o$ and $V_e$.

A low pixel count read will be described next. Addition of G signals will be described.

When G signals from the photoelectric conversion portions $a_{11}$ and $a_{22}$ in a unit cell are to be added in an odd field, the signals can be add by the input portion of the common amplifier. However, when G signals from the photoelectric conversion portions $a_{22}$ and $a_{31}$ are to be added in an even field, the signals cannot be added by the input portion of the common amplifier. The G signals are read out from the unit cells and then added. In this case, signals added by the common amplifier and those output from the common amplifiers and then added must be switched by an interlace pulse. However, it is difficult to accurately match the gains.

In the present invention, both G signals from the photoelectric conversion portions $a_{11}$ and $a_{22}$ and G signals from the photoelectric conversion portions $a_{22}$ and $a_{31}$ are added by a horizontal transfer means. The color signal reading method is the same as that described with reference to FIG. 6.

Signals of the same color are added by the signal read circuit shown in FIG. 7. In the circuit shown in FIG. 7, addition processing is performed through the same signal system, and no gain difference is generated. Referring to FIG. 7, signals are simultaneously output from the capacitances $C_{TN1}$, $C_{TS1}$, $C_{TN2}$, $C_{TS2}$, $C_{TN3}$, $C_{TS3}$, $C_{TN4}$, and $C_{TS4}$ to the horizontal output line by a horizontal shift register (H·SR) serving as the horizontal transfer means and switching transistors connected to the horizontal shift register. After differential amplifiers $A_1$ to $A_4$ subtract noise from the signals (containing a noise component), the signals are added by an adder. As another method, signals from the capacitances $C_{TS1}$ and $C_{TS4}$ may be added, and signals from the capacitances $C_{TN1}$ and $C_{TN4}$ may be added by the horizontal output line. Alternatively, the temporary storage capacitances may be connected for addition.

Figure 8:
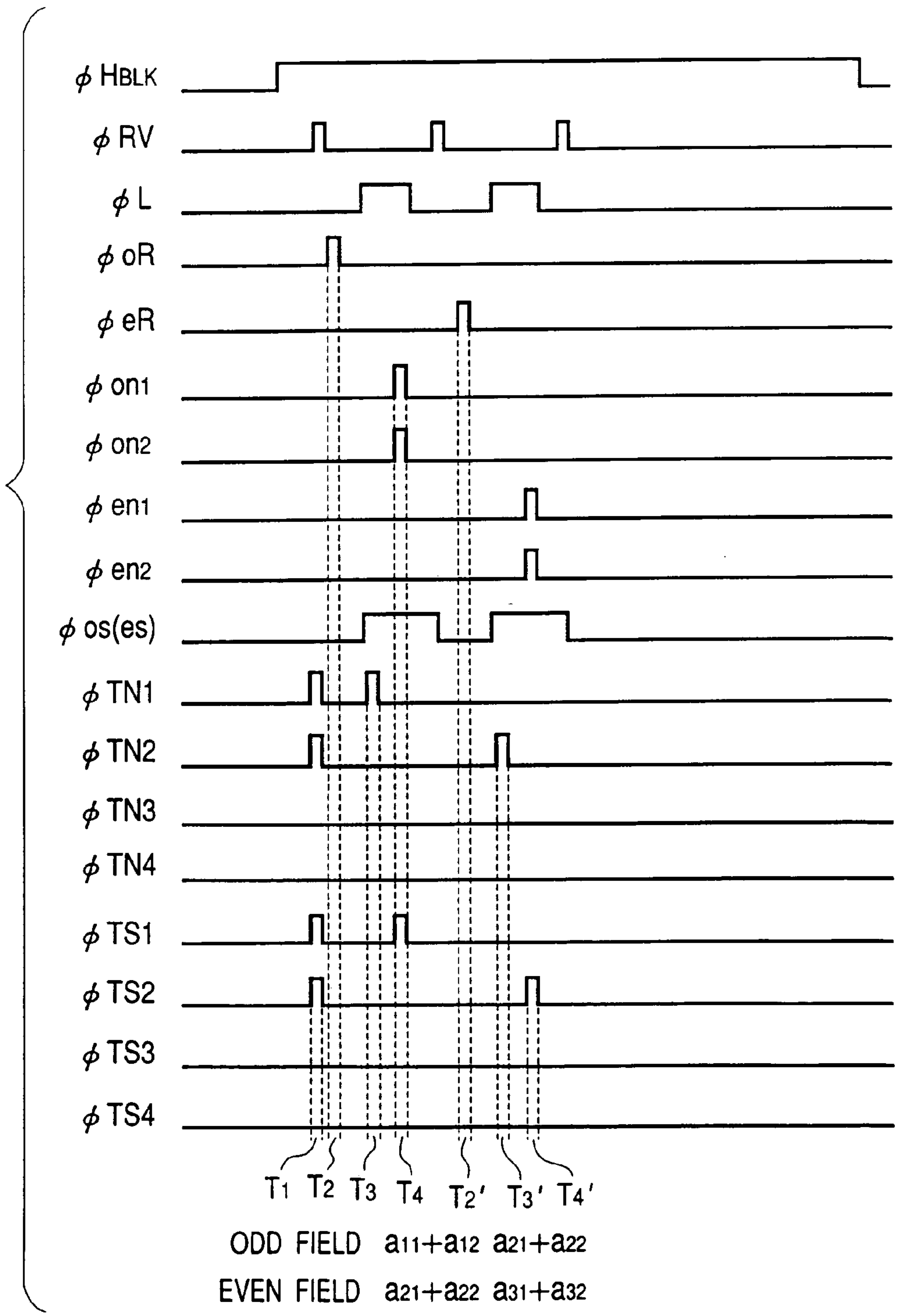
FIG. 8 is a timing chart of an arrangement in which color separation is not performed using a single sensor.

FIG. 8 is a timing chart of an arrangement in which color separation is not performed using a single sensor. In this case, since signals have the same color, pixel signals can be added in the horizontal direction by the input portion of a common amplifier. In an odd field to be described below, signals $a_{11}+a_{12}$, $a_{21}+a_{22}$ . . . can be obtained.

In the period $T_1$, the vertical signal line is reset by the pulse $\phi_{RV}$ to remove residual charges on the signal line. Simultaneously, the residual charges on the temporary storage capacitances $C_{TN1}$, $C_{TN2}$, $C_{TS1}$, and $C_{TS2}$ are removed by pulses $\phi_{TN1}$, $\phi_{TN2}$, $\phi_{TS1}$, and $\phi_{TS2}$.

In the period $T_2$, the gate of the common amplifier is reset by the pulse $\phi_{OR}$. In the period $T_3$, noise ($N_1$) of the common amplifier is transferred to a capacitance $C_{N1}$. In the period $T_4$, signals from a horizontal array of two photoelectric conversion portions are turned on by transfer pulses $\phi_{on1}$ and $\phi_{on2}$ and added by the gate portion. A signal ($S_1+N_1$; $S_1$ is the sum signal component of the horizontal array of two photoelectric conversion portions ($a_{11}+a_{12}$), and $N_1$ is the noise component) corresponding to the sum signal is transferred to a capacitance $C_{S1}$.

The vertical signal line is reset by the pulse $\phi_{RV}$ to remove residual charges on the signal line. In the period $T_2'$, the gate of the common amplifier is reset by the pulse $\phi_{OR}$. In the period $T_3'$, the noise ($N_2$) of the common amplifier is transferred to a capacitance $C_{N2}$. In the period $T_4'$, signals from a horizontal array of two photoelectric conversion portions are turned on by transfer pulses $\phi_{en1}$ and $\phi_{en2}$ and added by the gate portion. A signal ($S_2+N_2$; $S_2$ is the sum signal component of the horizontal array of two photoelectric conversion portions ($a_{21}+a_{22}$), and $N_2$ is the noise component) corresponding to the sum signal is transferred to a capacitance $C_{S2}$.

As shown in FIGS. 3A and 3B, the operation in even fields can be realized by changing the combinations of the vertical shift registers $V_o$ and $V_e$. In even fields, signals $a_{21}+a_{22}$, $a_{31}+a_{32}$, . . . can be obtained.

Figure 9:
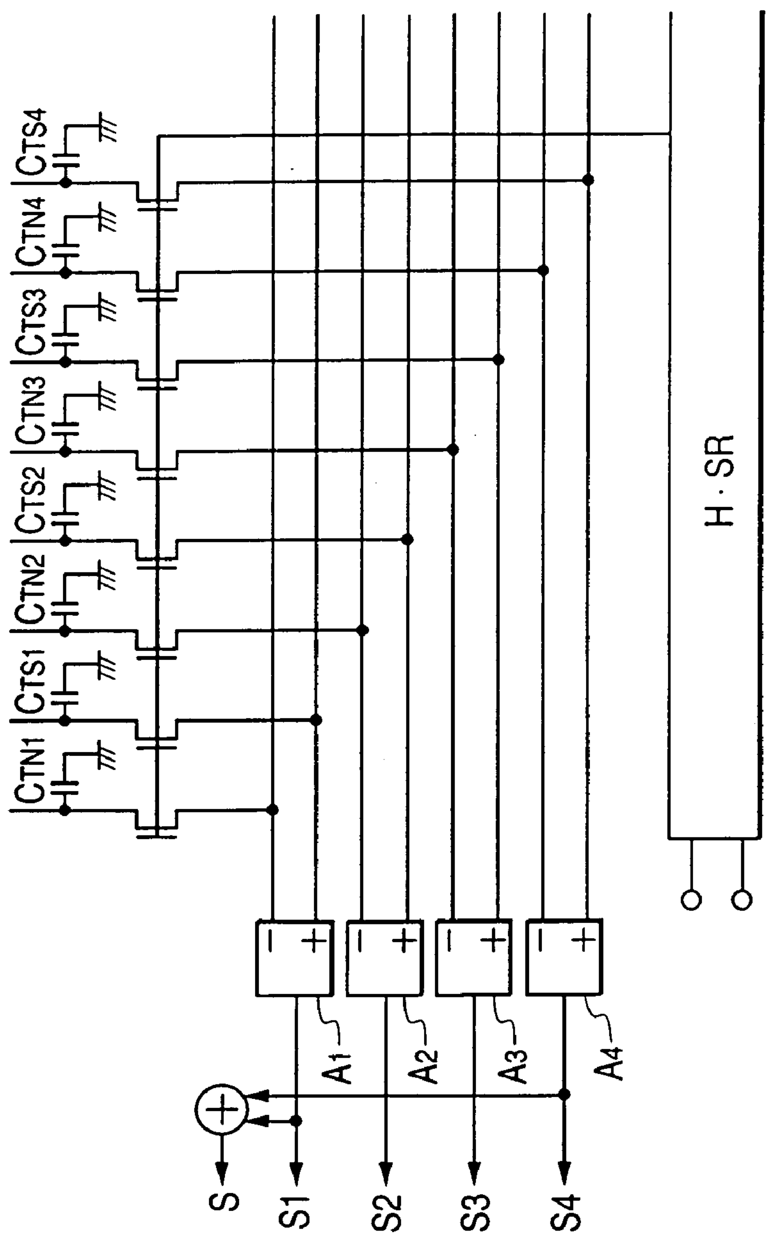
FIG. 9 is a circuit diagram of a read circuit for adding pixel signals in the vertical direction.

FIG. 9 is a circuit diagram of a read circuit for adding pixel signals in the vertical direction. The timing of reading out signals from the photoelectric conversion portions to the read circuit shown in FIG. 9 is the same as that described with reference to the timing chart shown in FIG. 6. Referring to FIG. 9, transistors for connecting the vertical output line to the capacitances $C_{TN1}$, $C_{TS1}$, $C_{TN2}$, $C_{TS2}$, $C_{TN3}$, $C_{TS3}$, $C_{TN4}$, and $C_{TS4}$ and the control signals $\phi_{TN1}$, $\phi_{TS1}$, $\phi_{TN2}$, $\phi_{TS2}$, $\phi_{TN3}$, $\phi_{TS3}$, $\phi_{TN4}$, and $\phi_{TS4}$ are not illustrated.

In the circuit shown in FIG. 9, signals are simultaneously output from the capacitances $C_{TN1}$, $C_{TS1}$, $C_{TN2}$, $C_{TS2}$, $C_{TN3}$, $C_{TS3}$, $C_{TN4}$, and $C_{TS4}$ to the horizontal output line by the horizontal shift register (H·SR) serving as a horizontal transfer means and switching transistors connected to the horizontal shift register. After the differential amplifiers $A_1$ to $A_4$ perform subtraction processing, signals S1 and S3 in the vertical direction are added by an adder. In odd fields, signals $a_{11}+a_{21}$, $a_{12}+a_{22}$, . . . are obtained. In the even fields, signals $a_{21}+a_{31}$, $a_{22}+a_{32}$ . . . are obtained. The signals may be added on the horizontal output line or temporary storage capacitances, as described above.

Addition of pixel signals in the horizontal direction or addition of pixel signals in the vertical or oblique direction is equivalent to the low pixel count signal read. For this reason, with driving according to the number of pixels in the recording or display system, a high-quality image with little moiré can be obtained at low power consumption.

In the above-described embodiment, signals from a plurality of photoelectric conversion portions are output to the vertical output line through common amplifiers. However, a circuit having functions except amplification may be used in place of the common amplifier to output the signals to the vertical output line.

That is to say, the image pickup apparatus of this embodiment includes a common circuit processing signals from a plurality of photoelectric conversion portions in common.

The second embodiment of the present invention will be described next.

In this embodiment, an addition switching means for arbitrarily switching addition of signals from a plurality of photoelectric conversion portions at the input portion of a common amplifier is used to allow switching between various addition reading and full pixel reading as shown in Table 1.

Figure 11:
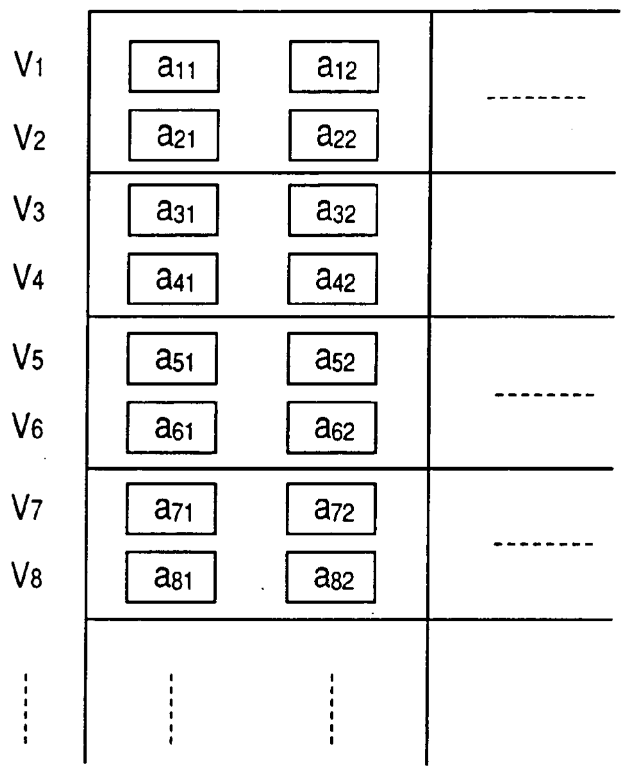
FIG. 11 is a schematic view showing a sensor so as to explain a sensor signal read mode.

FIG. 11 a schematic view showing a sensor so as to explain a sensor signal read mode.

This sensor has 1,300,000 effective pixels ($\propto$1024V×1280H), and four photoelectric conversion portions (e.g., $a_{11}$, $a_{12}$, $a_{21}$, and $a_{22}$) for one common amplifier. This sensor can switch the read mode between A. full pixel independent read mode, B. vertical/horizontal four-pixel addition read mode, C. horizontal two-pixel addition read mode, and D. vertical two-pixel addition read mode shown in Table 1. This embodiment is not limited to a sensor having four photoelectric conversion portions per common amplifier and can also be applied to a sensor having three or five or more photoelectric conversion portions per common amplifier.

TABLE 1

| Read mode | Non-Interlaced | Interlaced | Sensitivity |
|---|---|---|---|
| A. Full Pixel Independent | ○ | Possible | ×1 |
| B. Vertical/Horizontal Four-Pixel Addition | Possible | NTSC | ×4 |
| C. Horizontal Two-Pixel Addition | ○ | Possible | ×2 |
| D. Vertical Two-Pixel Addition | ○ | Possible | ×2 |

The full pixel read mode A in Table 1 is a read mode with priority on the resolution and used for, e.g., progressive (non-interlaced) 1,024 lines drive of a digital still camera. Signals are read sequentially in the order of line $V_1$ ($a_{11}$, $a_{12}$, . . . ), line $V_2$ ($a_{21}$, $a_{22}$, . . . ), . . . , line $V_{1024}$ upon every horizontal scanning.

The sensitivity at this time is represented by 1 (the sensitivity is represented by only the ratio of the number of pixels to be added because the sensitivity changes depending on the frame frequency and the storage time in the interlaced mode or non-interlaced mode).

The vertical/horizontal four-pixel addition read mode B in Table 1 is preferably used for interlaced drive of NTSC. In odd fields, signals are read out in the order of lines $V_1$ and $V_2$, lines $V_5$ and $V_6$ . . . . In even fields, signals are read out in the order of lines $V_3$ and $V_4$, lines $V_7$ and $V_8$. Since four pixel signals are added, signals $a_{11}+a_{12}+a_{21}+a_{22}$, $a_{13}+a_{14}+a_{23}+a_{24}$, . . . are obtained from the lines $V_1$ and $V_2$. The number of pixels after addition is 512V×640H. When 480V×640V signals are used, an NTSC signal is obtained. The sensitivity is four times (×8 in consideration of the interlaced mode) that of the full pixel read mode A.

In the horizontal two-pixel addition read mode C in Table 1, signals of two pixels adjacent in the horizontal direction are added. As a result, signals are read out in the order of line $V_1$ ($a_{11}+a_{12}$, $a_{13}+a_{14}$, . . . ), . . . , line $V_{1024}$.

In the vertical two-pixel addition read mode D in Table 1, signals of two pixels adjacent in the vertical direction are added. As a result, signals are read out in the order of lines $V_1$ and $V_2$ ($a_{11}+a_{21}$, $a_{12}+a_{22}$, . . . , lines $V_{1023}$ and $V_{1024}$.

The read modes B, C, and D in Table 1 are used when the sensitivity need be increased in a low-illuminance environment, the number of pixels of the photographing monitor is small, or the capacity of the recording system need be reduced, or in a low power mode.

Figure 10:
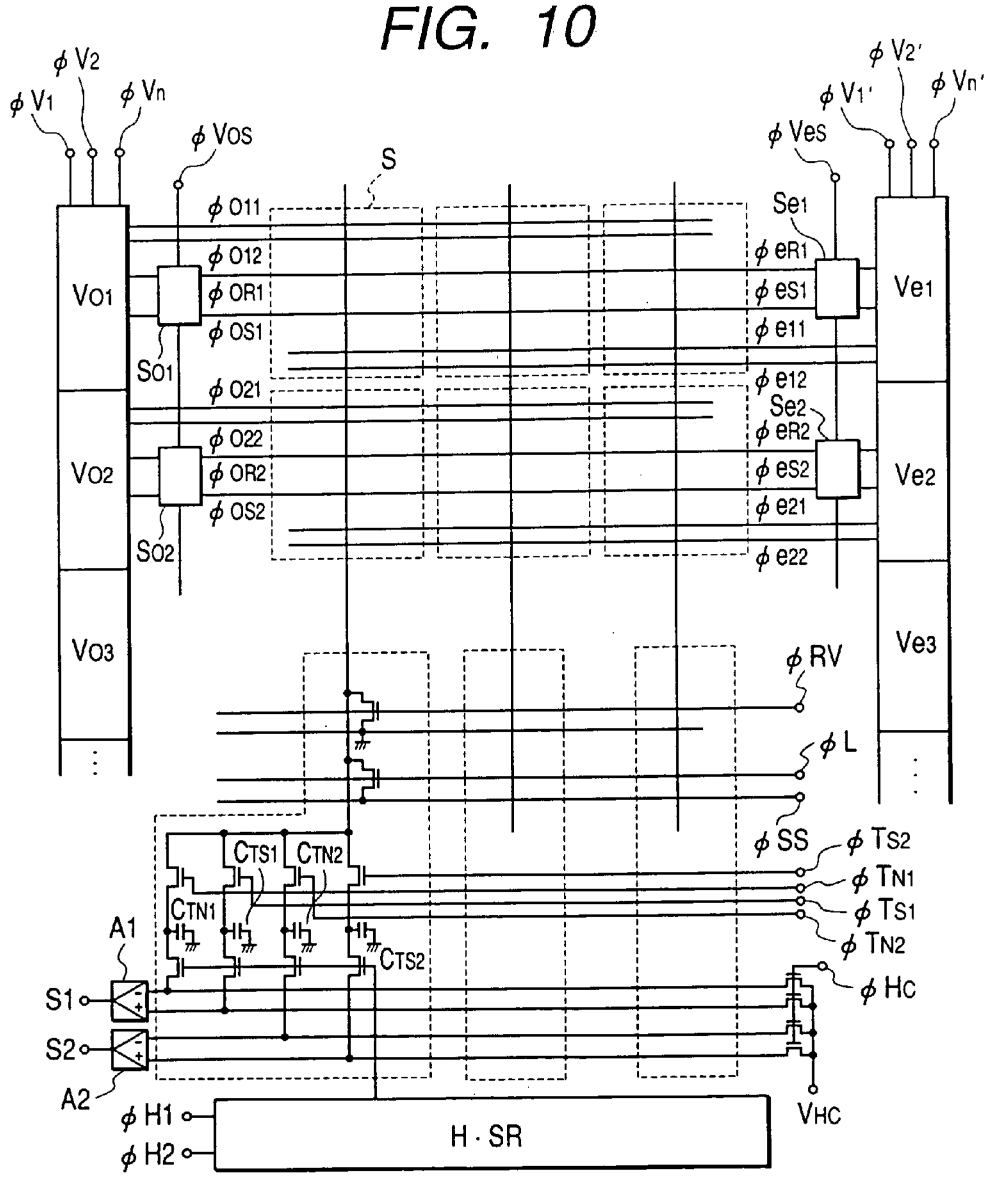
FIG. 10 is a schematic view showing the arrangement of an image pickup apparatus of the second embodiment.

FIG. 10 is a schematic view showing the arrangement of an image pickup apparatus. The arrangement of a unit cell S of the image pickup apparatus shown in FIG. 10 is the same as that shown in FIG. 2.

As shown in FIG. 2, the unit cell S is formed by arranging four photoelectric conversion portions ($a_{11}$, $a_{12}$, $a_{21}$, and $a_{22}$) for one common amplifier. The remaining unit cells have the same arrangement as that of the unit cell. The common amplifier comprises an amplification means MSF, reset means MRES, and select means MSEL. The input portion of the common amplifier corresponds to the gate portion of the amplification means MSF.

Lines for controlling signal transfer for two upper photoelectric conversion portions ($a_{11}$ and $a_{12}$) of the four pixels, that are adjacent to each other in the horizontal direction are connected to an odd vertical shift register $V_o$ ($V_{o1}$, $V_{o2}$, $V_{o3}$, . . . ). Lines for controlling signal transfer for two lower photoelectric conversion portions ($a_{21}$ and $a_{22}$) that are adjacent to each other in the horizontal direction are connected to an even-numbered vertical shift register $V_e$ ($V_{e1}$, $V_{e2}$, $V_{e3}$, . . . ). The reset switch MRES and select switch MSEL of the common amplifier are connected to the corresponding vertical shift registers $V_o$ and $V_e$ through an odd selection circuit $S_o$ and an even selection circuit $S_e$, respectively. The vertical shift registers $V_o$ and $V_e$ and selection circuits $S_o$ and $S_e$ can be independently controlled. The vertical shift registers $V_o$ and $V_e$ and selection circuits $S_o$ and $S_e$ construct an addition switching means.

Figure 12A:
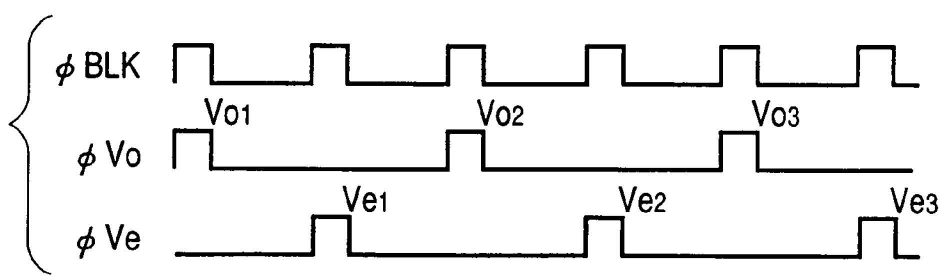
FIGS. 12A and 12B are timing charts showing driving examples of vertical shift registers according to a read mode in Table 1.
Figure 12B:
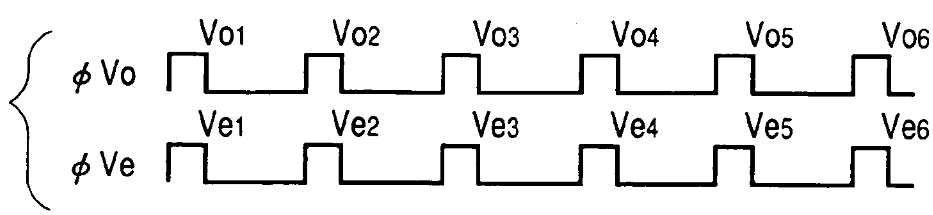

FIGS. 12A and 12B show driving examples of the vertical shift registers corresponding to the read modes shown in Table 1. FIG. 12A shows non-interlaced (progressive) driving. Control signals $\phi_o$ ($\phi_{o11}$, $\phi_{o12}$, $\phi_{o21}$, $\phi_{o22}$, . . . ) are output from the vertical shift registers $V_o$ while control signals $\phi_e$ ($\phi_{e11}$, $\phi_{e12}$, $\phi_{e21}$, $\phi_{e22}$, . . . ) are output from the vertical shift registers $V_e$. Scanning is sequentially performed every 1H interval, and the pixel signals of the horizontal lines are sequentially controlled. This driving allows the full pixel independent read or horizontal two-pixel addition read.

FIG. 12B shows two-line simultaneous driving in units of four pixels of a common amplifier or two vertically adjoining pixels. The control signals $\phi_o$ from the vertical shift registers $V_o$ and the control signals $\phi_e$ from the vertical shift registers $V_e$ are driven in phase. This driving allows the vertical two-pixel addition read or vertical/horizontal four-pixel addition read.

The read modes shown in Table 1 will be described in more detail with reference to timing charts.

Figure 13:
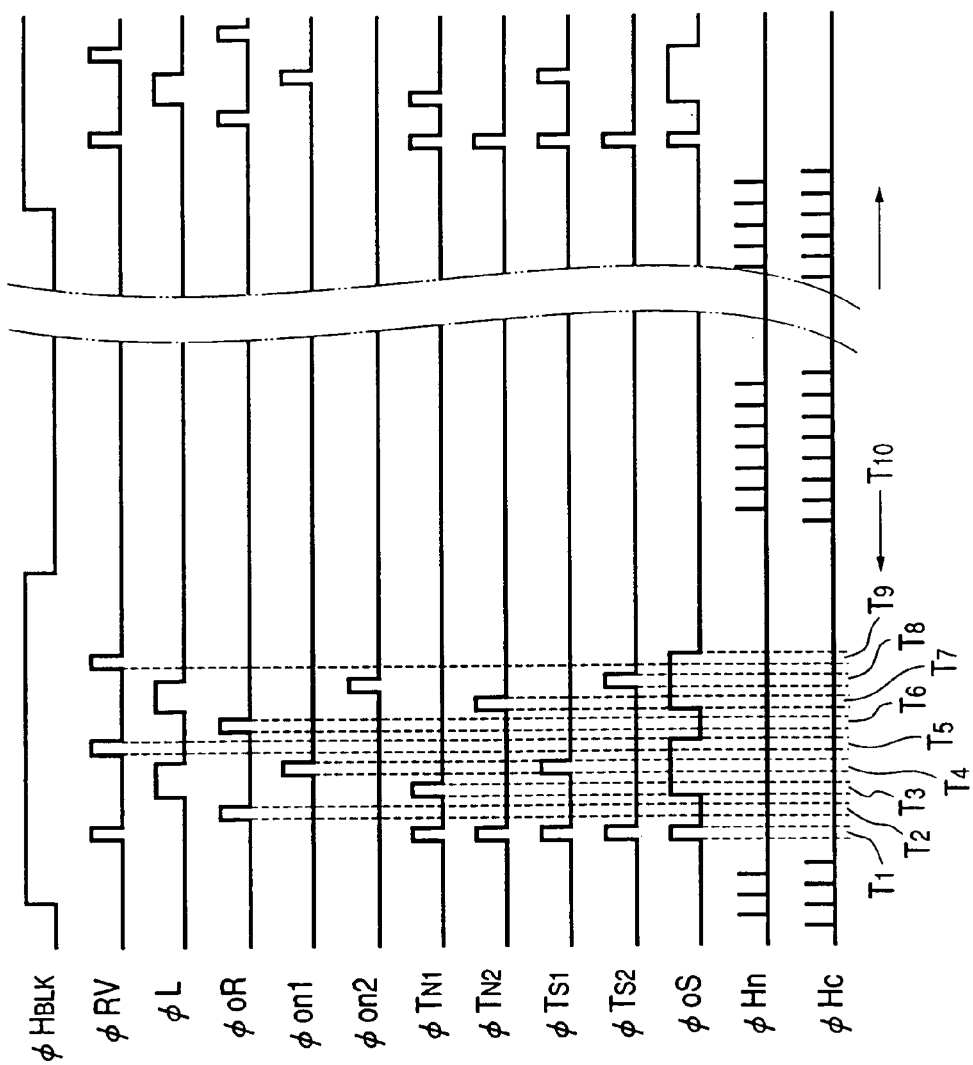
FIG. 13 is a timing chart of a read mode A (full pixel read) in Table 1.

FIG. 13 is a timing chart of the read mode A (full pixel read).

In a horizontal blanking period (HBLK), signals photoelectrically converted in the pixels are transferred, and the photoelectric conversion portions are reset to the initial state. Signal transfer and reset of the photoelectric conversion portions of the first row are controlled by the odd vertical shift register $V_o$ and odd selection circuit $S_o$.

In a period $T_1$, the vertical signal line is reset by a pulse $\phi_{RV}$ to remove residual charges on the signal line. In addition, the residual charges on temporary storage capacitances $C_{TN1}$, $C_{TN2}$, $C_{TS1}$, and $C_{TS2}$ by pulses $\phi_{TN1}$, $\phi_{TN2}$, $\phi_{TS1}$, and $\phi_{TS2}$, respectively.

In a period $T_2$, as preprocessing for transfer of odd-numbered photoelectric conversion signals in the photoelectric conversion portions ($a_{11}$, $a_{12}$, . . . , $a_{1n}$) of the first row, the gate portion of the amplification means MSF of each common amplifier is reset by a pulse $\phi_{oR}$ to remove residual charges. After removal, reset noise remains in the gate portion.

In a period $T_3$, the reset noise and the offset voltage of the common amplifier in the period $T_2$ are transferred to the capacitance $C_{TN1}$. The output portion of each common amplifier is connected to the vertical signal line in accordance with a pulse $\phi_{oS}$, a load MOS transistor is turned on in accordance with a pulse $\phi_L$ to operate the common amplifier, and the vertical signal line and capacitance $C_{TN1}$ are connected in accordance with the pulse $\phi_{TN1}$. Noise (N) is stored in the capacitance $C_{TN1}$.

In a period $T_4$, odd-numbered ($a_{11}$, $a_{13}$, . . . , $a_{1n}$) photoelectric conversion signals are transferred to the capacitance $C_{TS1}$. Portions from the common amplifier to the capacitance $C_{TS1}$ are turned on by the pulses $\phi_L$, $\phi_{TS1}$, and $\phi_{oS}$.

In accordance with a pulse $\phi_{o11}$, the photoelectric conversion signals are transferred from the photoelectric conversion portions to the gate portion of the common amplifier. At this time point, the photoelectric conversion portions are added to the reset noise in the period $T_2$ at the gate. This gate voltage is superposed on the offset voltage of the common amplifier and stored in the capacitance $C_{TS1}$ as a signal (S+N).

In periods $T_5$ to $T_8$, even-numbered photoelectric conversion signals ($a_{12}$, $a_{14}$, . . . , $a_{1n-1}$) are transferred to the capacitance $C_{TS2}$. The basic operation is the same as in the periods $T_1$ to $T_4$ except that pulse control changes as $\phi_{o11} \rightarrow \phi_{o12}$, $\phi_{TN1} \rightarrow \phi_{TN2}$, and $\phi_{TS1} \rightarrow \phi_{TS2}$.

In a period $T_9$, residual charges between the vertical signal line, common amplifier, and transfer MOS transistor are removed, thereby ending the basic operation of transferring the reset noise and photoelectric conversion signals.

With the above-described driving, the noise components N1 and N2 and signals S1+N1 and S2+N2 are stored in the capacitances. These noise and signal components are transferred to the horizontal output line in accordance with pulses $\phi$H1 and $\phi$H2 from the horizontal shift register during a period $T_{10}$. An output amplifier A1 calculates subtraction (S1+N1)−N1 to output the signal S1. An output amplifier A2 calculates subtraction (S2+N2)−N2 to output the signal S2.

With this operation, only the photoelectric conversion signals of the row ($a_{11}$, . . . , $a_{1n}$) to undergo photoelectric conversion are obtained. To store pixel signals of the row, when the photoelectric conversion signals are transferred to the gate portion in the periods $T_4$ and $T_8$, photoelectric conversion is started.

In the next horizontal blanking period, signals from the photoelectric conversion portions of the second row are read as in the first row. Signal transfer and reset of the photoelectric conversion portions of the second row are controlled by the even vertical shift register $V_e$ and even selection circuit $S_e$.

Figure 14:
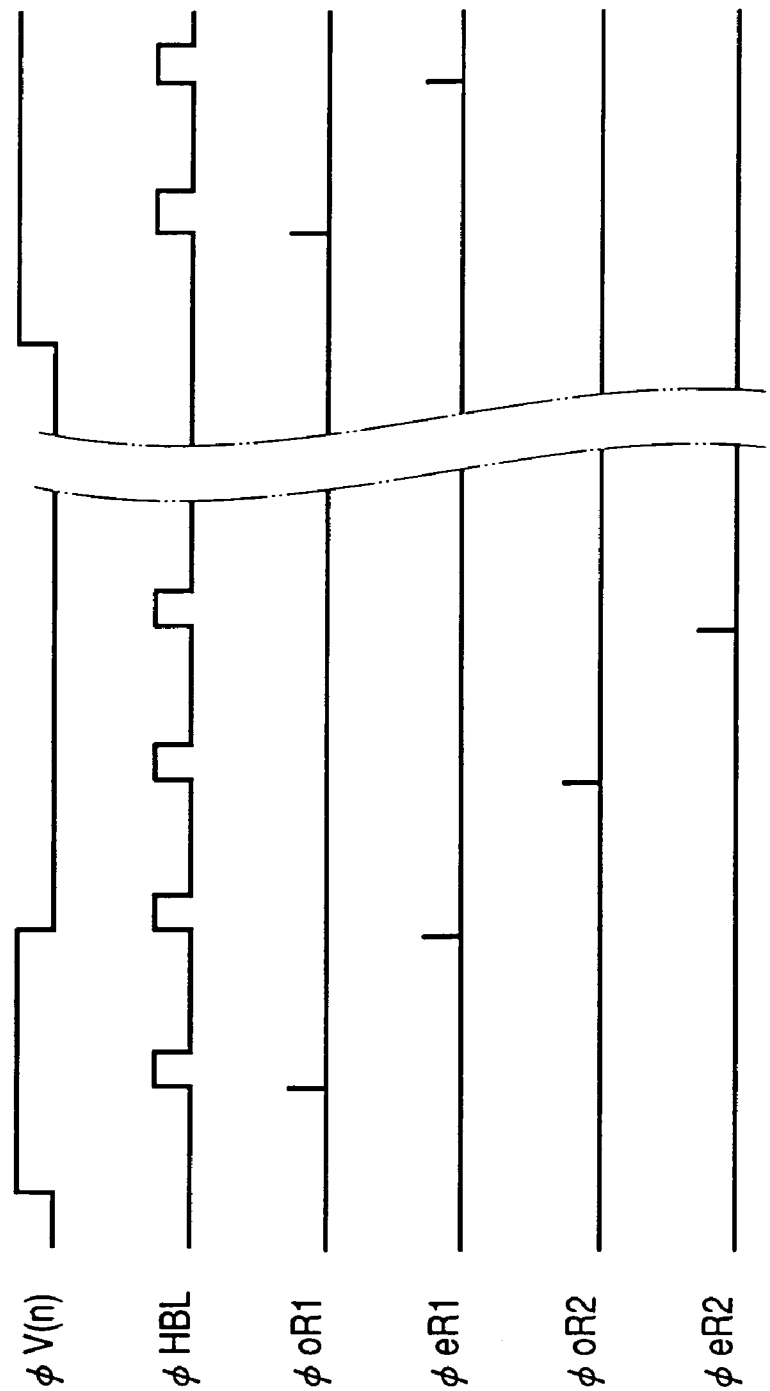
FIG. 14 is a timing chart schematically showing the vertical timing.

FIG. 14 is a timing chart schematically showing the vertical timing. In a vertical period, the above-described operation in the horizontal period is sequentially performed a number of times equal to the number of pixels in the vertical direction. The vertical shift registers output driving pulses $\phi_{on1}$, $\phi_{on2}$ ($\phi_{en1}$, $\phi_{en2}$), $\phi_{oRn}$, $\phi_{oSn}$, ($\phi_{eRn}$, $\phi_{eSn}$) in units of rows every 1H interval.

Figure 15:
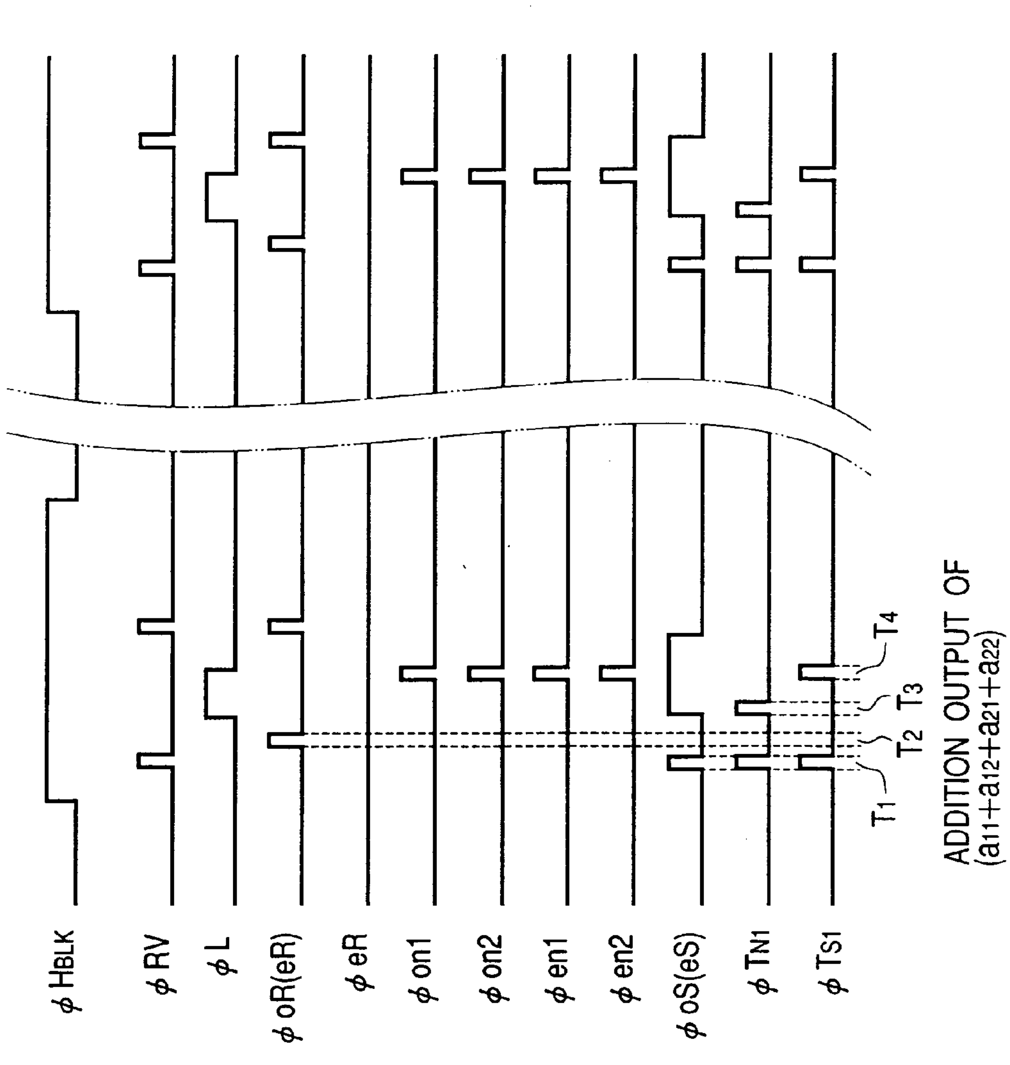
FIG. 15 is a timing chart of a read mode B (vertical/horizontal four-pixel addition) in Table 1.

FIG. 15 is a timing chart of the read mode B (vertical/horizontal four-pixel addition). Signal transfer and reset of vertical/horizontal four-pixel sum signals are controlled by odd and even vertical shift registers $V_o$ and $V_e$ and odd selection circuits $S_o$ (or even selection circuits $S_e$).

In the period $T_1$, the vertical signal line is reset by the pulse $\phi_{RV}$ to remove residual charges on the signal line. In addition, the residual charges on the temporary storage capacitances $C_{TN1}$ and $C_{TS1}$ are removed by the pulses $\phi_{TN1}$ and $\phi_{TS1}$.

In the period $T_2$, the gate of the common amplifier is reset by the pulse $\phi_{OR}$. In the period $T_3$, noise ($V_n$) of the common amplifier is transferred to the capacitance $C_{TN1}$. In the period $T_4$, transfer switches MTX1 to MTX4 of four pixels are turned on by the transfer pulses $\phi_{o11}$, $\phi_{o12}$, $\phi_{e11}$, and $\phi_{e12}$, and signals from the photoelectric conversion portions are added by the gate portion of the amplification means MSF of the common amplifier. A signal ($V_s$+$V_n$; $V_s$ is the sum signal component of four photoelectric conversion portions ($a_{11}$+$a_{12}$+$a_{21}$+$a_{22}$), and $V_n$ is the noise component) corresponding to the sum signal is transferred to the capacitance $C_{TS1}$. The differential amplifier A1 removes the noise ($V_n$) from the signal and noise components. The output signal S1 contains only the photoelectric conversion signal ($V_s$) without amplifier noise. In the interlaced driving mode, driving is performed every other line.

In the next horizontal blanking period, the operation of the photoelectric conversion portions of the third and fourth rows is performed as in the first and second rows.

Figure 16:
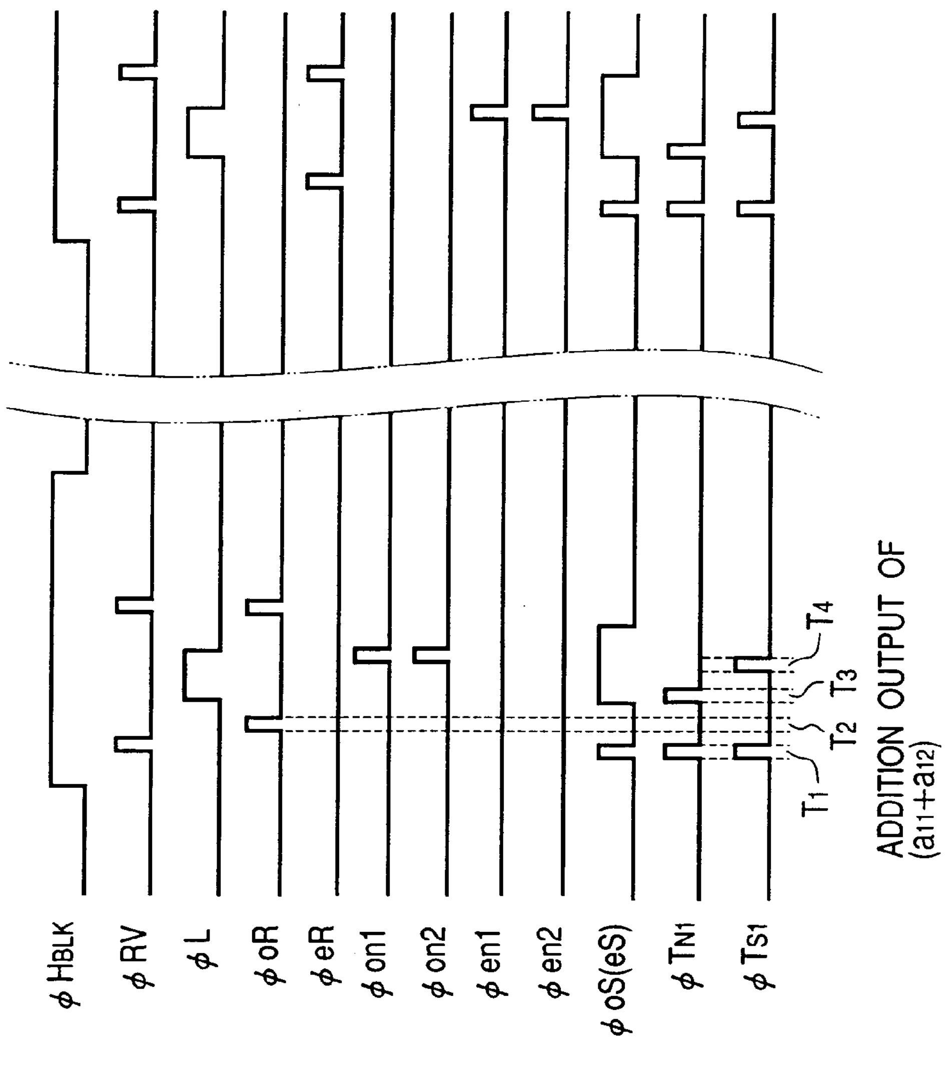
FIG. 16 is a timing chart of a read mode C (horizontal two-pixel addition) in Table 1.

FIG. 16 is a timing chart of the read mode C (horizontal two-pixel addition). Signal transfer and reset of the photoelectric conversion portions of the first row are controlled by the odd vertical shift register $V_o$ and odd selection circuit $S_o$.

In the period $T_1$, the vertical signal line is reset by the pulse $\phi_{RV}$ to remove residual charges on the signal line. In addition, the residual charges on the temporary storage capacitances $C_{TN1}$ and $C_{TS1}$ are removed by the pulses $\phi_{TN1}$ and $\phi_{TS1}$.

In the period $T_2$, the gate of the amplification means MSF of the common amplifier is reset by the pulse $\phi_{OR}$. In the period $T_3$, the noise ($V_n$) of the common amplifier is transferred to a capacitance $C_{N1}$. In the period $T_4$, signals from a horizontal array of two photoelectric conversion portions are turned on by the transfer pulses $\phi_{on1}$ and $\phi_{on2}$ and added by the gate portion. A signal ($V_s+V_n$; $V_s$ is the sum signal component of the horizontal array of two photoelectric conversion portions ($a_{11}+a_{12}$), and $V_n$ is the noise component) corresponding to the sum signal is transferred to a capacitance $C_{S1}$. The differential amplifier A1 removes the noise ($V_n$) from the signal and noise components. The output signal S1 contains only the photoelectric conversion signal ($V_s$) without amplifier noise.

In the next horizontal blanking period, the operation of the photoelectric conversion portions of the second row is performed as in the first row.

Signal transfer and reset of the photoelectric conversion portions of the second row are controlled by the even vertical shift register $V_e$ and even selection circuit $S_e$.

Figure 17:
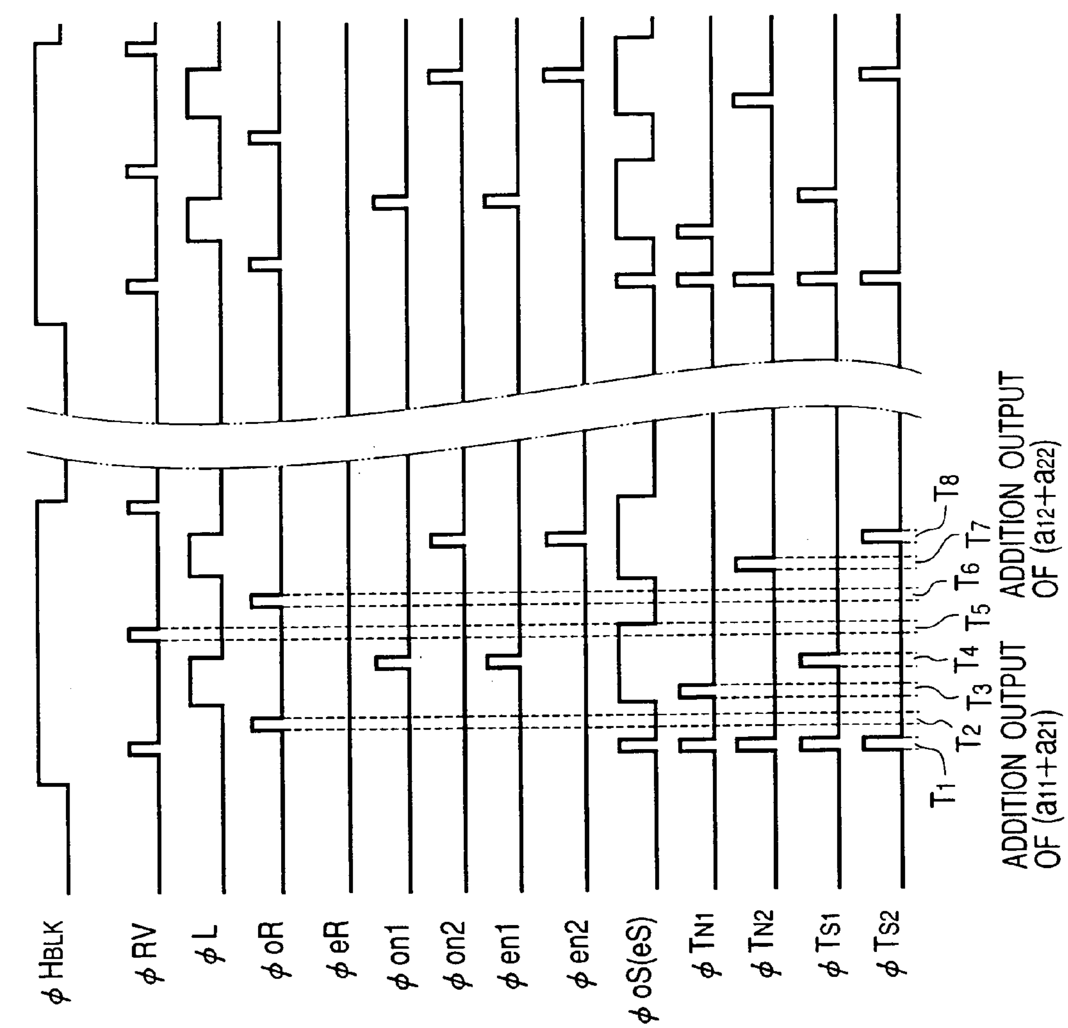
FIG. 17 is a timing chart of a read mode D (vertical two-pixel addition) in Table 1.

FIG. 17 is a timing chart of the read mode D (vertical two-pixel addition). Signal transfer and reset of vertical two-pixel sum signals are controlled by odd and even vertical shift registers $V_o$ and $V_e$ and odd selection circuits $S_o$ (or even selection circuits $S_e$).

In the period $T_1$, the vertical signal line is reset by the pulse $\phi_{RV}$ to remove residual charges on the signal line. In addition, the residual charges on the temporary storage capacitances $C_{TN1}$, $C_{TN2}$, $C_{TS1}$, and $C_{TS2}$ are removed by the pulses $\phi_{TN1}$, $\phi_{TN2}$, $\phi_{TS1}$, and $\phi_{TS2}$, respectively.

In the period $T_2$, the gate of the amplification means MSF of the common amplifier is reset by a pulse $\phi_{OR1}$. In the period $T_3$, noise ($V_{n1}$) of the common amplifier is transferred to the capacitance $C_{N1}$. In the period $T_4$, signals from a vertical array of two photoelectric conversion portions of the first column are turned on by transfer pulses $\phi_{on1}$ and $\phi_{en1}$ and added by the gate portion. A signal ($V_{s1}+V_{n1}$; $V_{s1}$ is the sum signal component of the vertical array of two photoelectric conversion portions ($a_{11}+a_{21}$), and $V_{n1}$ is the noise component) corresponding to the sum signal is transferred to the capacitance $C_{S1}$.

In the period $T_5$, the gate of the amplification means MSF of the common amplifier is reset by the pulse $\phi_{OR1}$. In the period $T_6$, noise ($V_{n2}$) of the common amplifier is transferred to the capacitance $C_{N2}$. In the period $T_7$, signals from a vertical array of two photoelectric conversion portions of the second column are turned on by transfer pulses $\phi_{on2}$ and $\phi_{en2}$ and added by the gate portion. A signal ($V_{s2}+V_{n2}$; $V_{s2}$ is the sum signal component of the vertical array of two photoelectric conversion portions ($a_{12}+a_{22}$), and $V_{n2}$ is the noise component) corresponding to the sum signal is transferred to the capacitance $C_{S2}$. After this, noise of a capacitance $C_{n1}$ is removed from the signal of the capacitance $C_{S1}$, and noise of a capacitance $C_{n2}$ is removed from the signal of the capacitance $C_{S2}$.

In the next horizontal blanking period, the operation of the photoelectric conversion portions of the third and fourth rows is performed as in the first and second rows.

In the above arrangement, signals from a plurality of photoelectric conversion portions are output to the vertical output line through common amplifiers. However, a circuit having functions except amplification may be used in place of the common amplifier to output the signals to the vertical output line.

That is to say, the image pickup apparatus of this embodiment includes a common circuit processing signals from a plurality of photoelectric conversion portions in common.

The third embodiment of the present invention will be described next.

In first embodiment signals from a plurality of photoelectric conversion portions in a unit cell and outside the unit cell can be added. In second embodiment, the mode can be switched between a mode for independently reading out signals from all photoelectric conversion portions of the unit cell, a mode for reading out a sum signal from four photoelectric conversion portions of the unit cell in the vertical and horizontal directions, a mode for reading out a sum signal from two, horizontally adjacent photoelectric conversion portions of the unit cell, and a mode for reading out a sum signal from two, vertically adjacent photoelectric conversion portions of the unit cell.

In this embodiment, the above four modes can be switched by combining the arrangements of the first and second embodiments. In addition, not only a sum signal from a plurality of photoelectric conversion portions in the unit cell but also a sum signal from a plurality of photoelectric conversion portions in different unit cells can be obtained.

Figure 18:
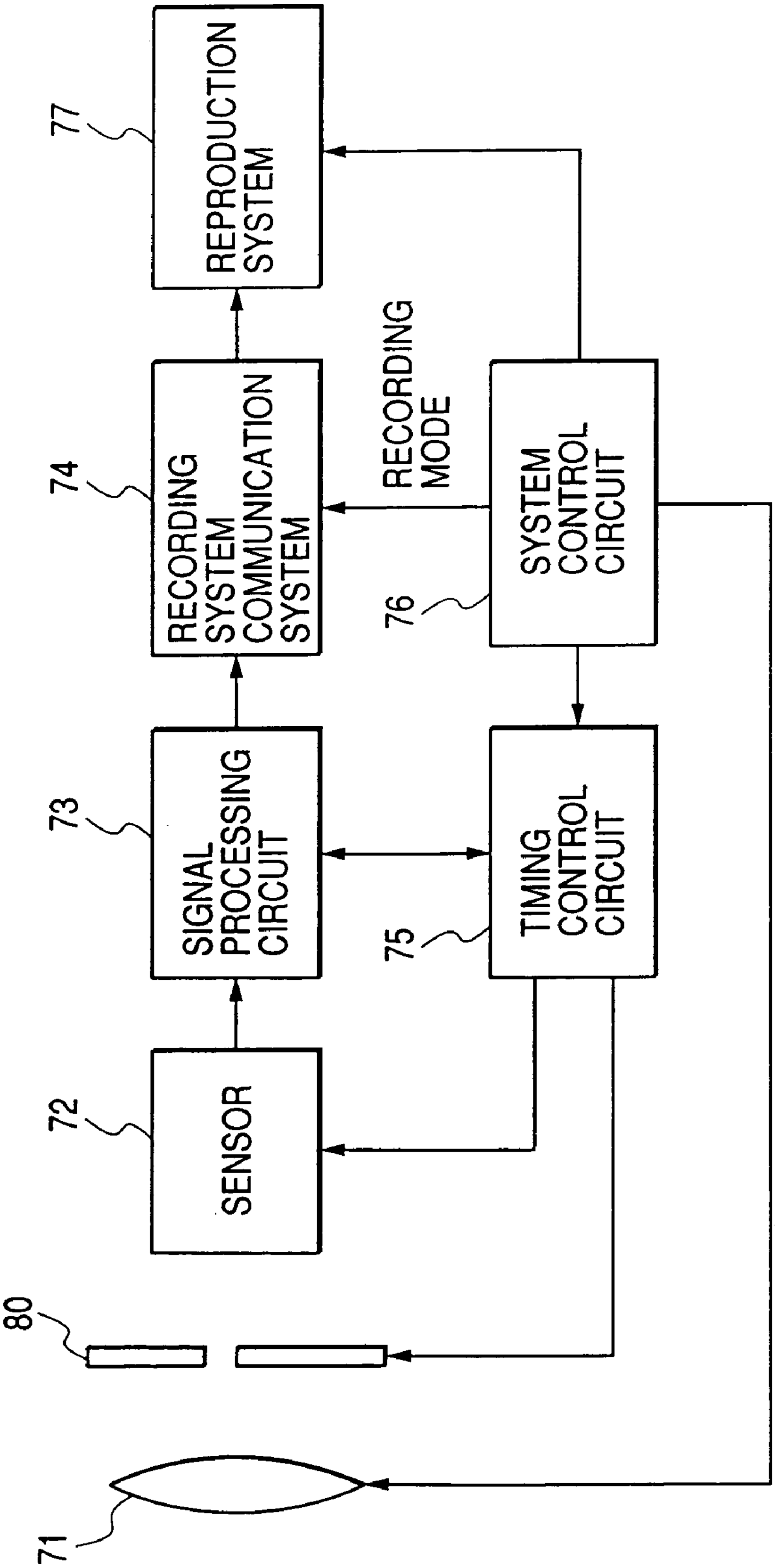
FIG. 18 is a block diagram showing the schematic arrangement of a system according to the fourth embodiment.

FIG. 18 is a block diagram showing the schematic arrangement of an image pickup system according to the fourth embodiment of the present invention, in which the image pickup apparatus described in the first to third embodiments is used. As shown in FIG. 18, the image of light incident through an optical system 71 and stop 80 is formed on an image pickup apparatus 72. The optical information is converted into an electrical signal by a pixel array formed on the image pickup apparatus 72. A signal processing circuit 73 processes the electrical signal by a predetermined method and outputs the signal. The processed signal is recorded or transferred by a recording system/communication system 74. The recorded or transferred signal is reproduced by a reproduction system 77. The iris 80, image pickup apparatus 72, and signal processing circuit 73 are controlled by a timing control circuit 75. The optical system 71, timing control circuit 75, recording system/communication system 74, and reproduction system 77 are controlled by a system control circuit 76. The image pickup apparatus 72 and the remaining signal processing circuits may be formed on different semiconductor substrates or on a single semiconductor substrate by the CMOS process.

The above-described high pixel count read (full pixel read) and low pixel count read (addition read) use different horizontal and vertical driving pulses. Hence, the sensor drive timing, resolution processing by the signal processing circuit, and the number of pixels to be recorded by the recording system must be changed in units of read modes. This change is controlled by the system control circuit 76 according to each read mode. In the read mode, the sensitivity is changed by addition. For example, the signal amount in the addition read is twice that in the high pixel count read, and the dynamic range is halved. In this case, an appropriate signal is obtained by controlling the iris 80 to be smaller by ½. This allows photographing at a ½ illuminance.

In fifth embodiment, the detailed arrangement of the unit cell suitable for the image pickup apparatus described in the first to third embodiments will be described.

Figure 26:
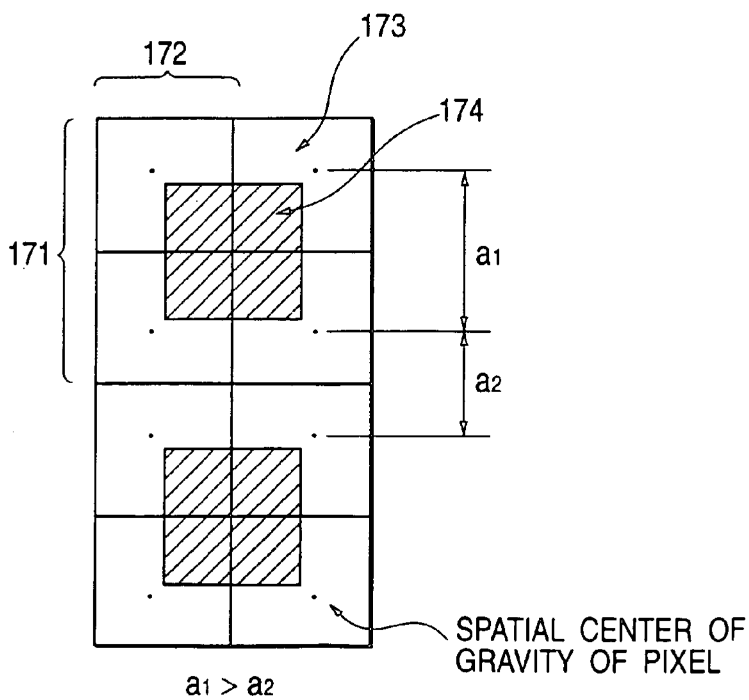
FIG. 26 is a view showing an example of the layout of unit cells of the image pickup apparatus.

The layout shown in FIG. 26 has the following problem because photoelectric conversion portions 173 are not laid out at an equal interval ($a_1 \neq a_2$), and the areas (light-receiving portions) for sensing light in the pixels are not arranged at an equal interval. More specifically, a layout with different pitches partially have different spatial frequencies and resolutions and therefore reduces the resolution or generate errors such as moiré fringes. Moiré fringes pose a very serious problem, and an image pickup apparatus having moiré fringes is practically useless as a product. This also applies when the number of pixels of the unit cell is not 4.

The present inventors have proposed that even in an image pickup apparatus having an amplification means distributed to a plurality of pixels, when the photoelectric conversion portions are laid out at an equal pitch, the light-receiving portions can be laid out at an equal pitch, any decrease in resolution and moiré fringes can be prevented, the opening ratio can be increased, and satisfactory performance can be obtained.

Figure 19:
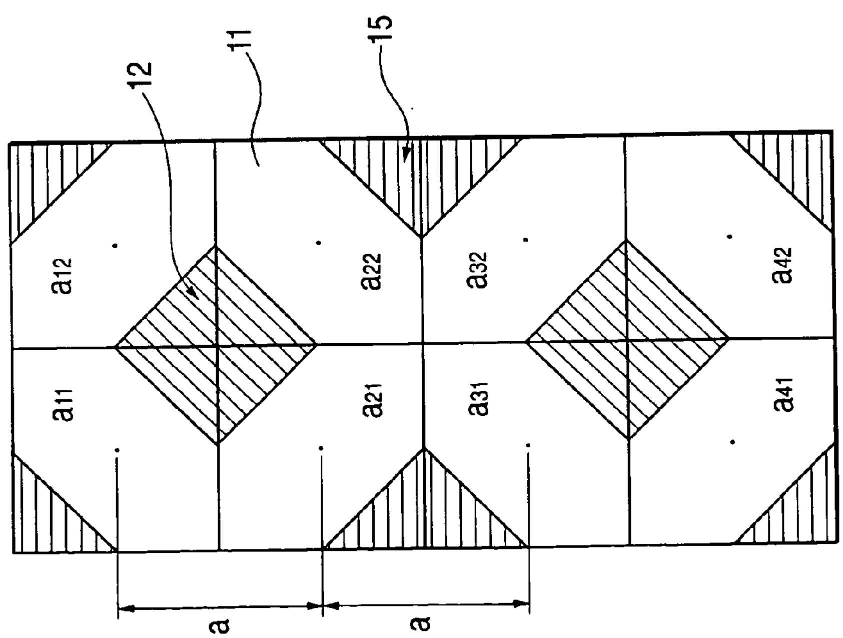
FIG. 19 is a view showing a layout of unit cells in the fifth embodiment.

FIG. 19 is a view showing an example in which 2×2 pixels share a common amplifier portion 12. Referring to FIG. 19, the common amplifier portion 12 to be shared is arranged at the center of the four pixels, and four photoelectric conversion portions ($a_{11}$, $a_{12}$, $a_{21}$, and $a_{22}$) surround the common amplifier portion 12. The common amplifier portion 12 includes not only an amplification means MSF, reset means MRES, and select means MSEL shown in FIG. 2 but also transfer means MTX1 to MTX4.

A light-shielding portion 15 is present at a position line-symmetric with respect to the area of the common amplifier portion 12 in each pixel. Hence, the center of gravity of a photoelectric conversion portion 11 of each pixel is present at the center of the pixel. The four photoelectric conversion portions ($a_{11}$ to $a_{22}$) can be laid out at an equal interval a in the vertical and horizontal directions.

Figure 20:
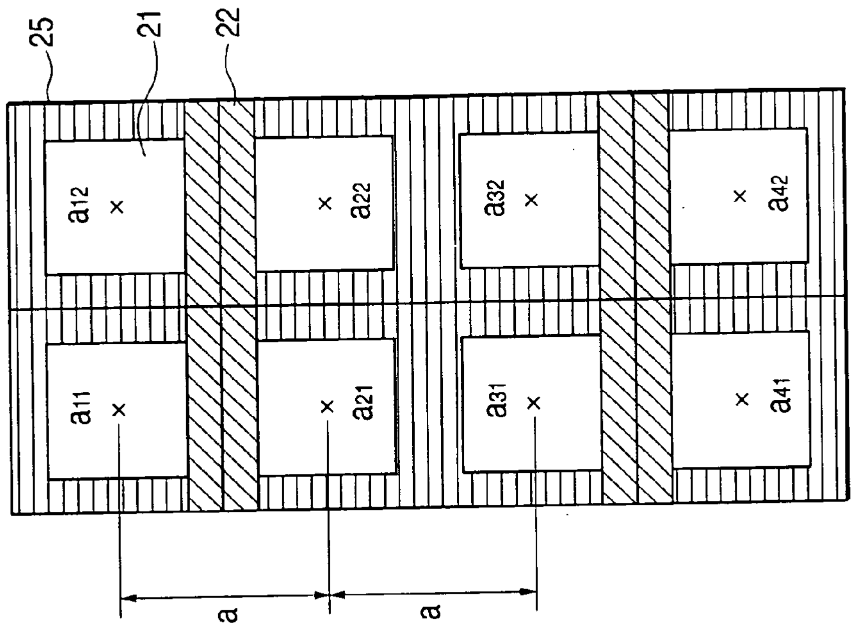
FIG. 20 is a view showing another layout of unit cells in the fifth embodiment.

Referring to FIG. 20, a common amplifier portion 22 to be shared is arranged at the central portion of four pixels in the horizontal direction, and four photoelectric conversion portions ($a_{11}$, $a_{12}$, $a_{21}$, and $a_{22}$) 21 sandwich the common amplifier portion 22.

A light-shielding portion 25 is present at a position line-symmetric with respect to the area of the common amplifier portion 22 in each pixel. Hence, the center of gravity of the photoelectric conversion portion 21 of each pixel is present at the center of the pixel. The four photoelectric conversion portions ($a_{11}$ to $a_{22}$) can be laid out at the equal interval a in the vertical and horizontal directions.

In the embodiment shown in FIG. 20, the horizontal and vertical directions may be replaced.

Figure 21:
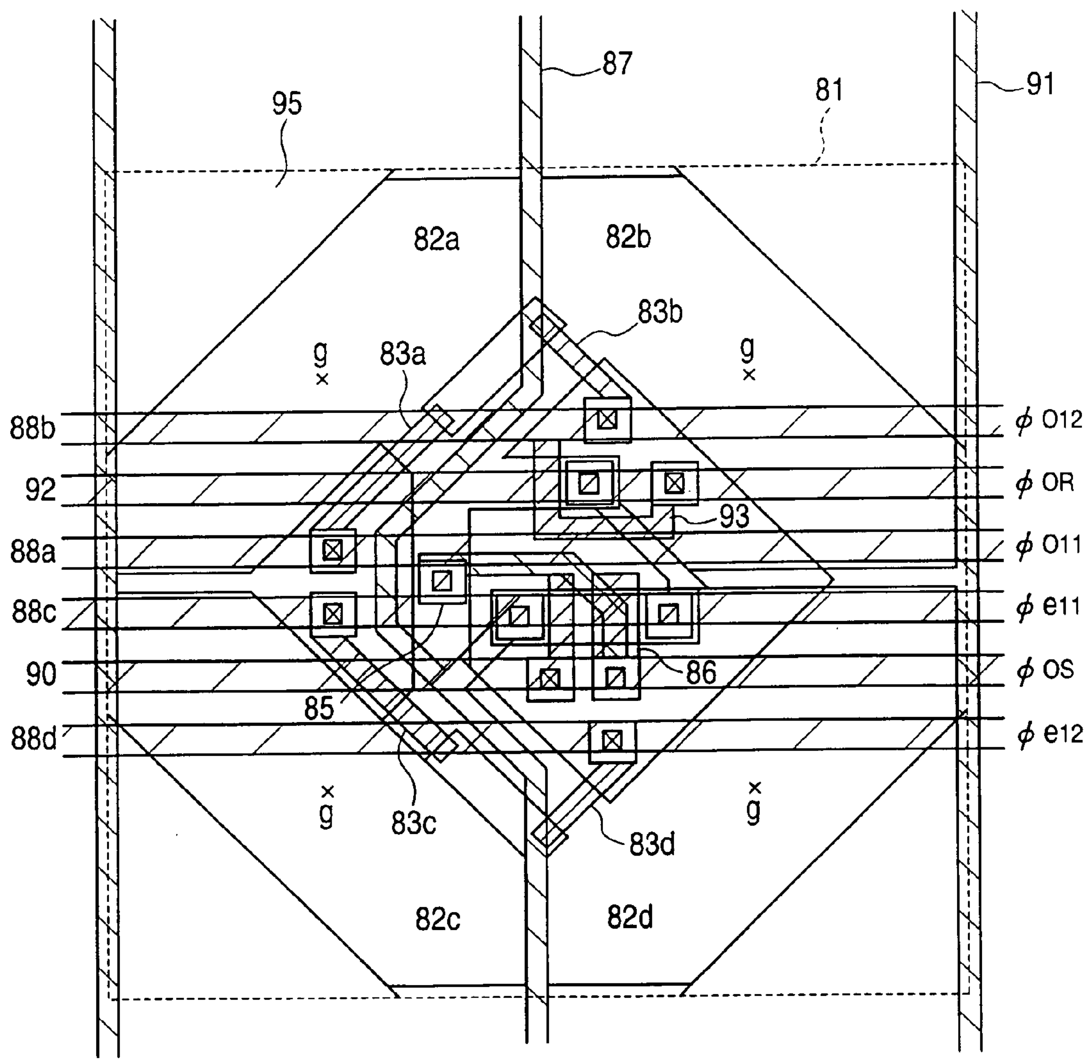
FIG. 21 is a view showing a pattern layout of the fifth embodiment.

FIG. 21 is a view showing the detailed pattern layout of the first example of the pixel array portion of the image pickup apparatus.

The image pickup apparatus shown in FIG. 21 is formed on a single-crystal substrate by a layout rule of 0.4 μm. The pixel is an 8-μm side square. The source follower amplifier as an amplification means is shared by 2×2=4 pixels. Hence, each of repeated unit cells 81 is a 16 μm×16 μm side square, and a two-dimensional array is formed.

Photodiodes 82*a*, 82*b*, 82*c*, and 82*d* as photoelectric conversion portions are formed diagonally at the centers of the pixels. The photodiodes have an almost rotationally symmetric and mirror-image symmetric shape in the vertical and horizontal directions. The photodiodes 82*a*, 82*b*, 82*c*, and 82*d* have the same center g of gravity in the pixels. Light-shielding portions 95 are also formed.

The image pickup apparatus also has a scanning line 88*a* for controlling a transfer gate 83*a* at the upper left, a row selection line 90, and a reset line 92 for controlling a MOS gate 93.

Signal charges stored in the photodiodes 82*a* to 82*d* are sent to an FD 85 through transfer gates 83*a* to 83*d*. The MOS size of each of the gates 83*a* to 83*d* is L= 0.4 μm and W=1.0 μm (L is the channel length, and W is the channel width).

The FD 85 is connected to an input gate 86 of the source follower through a 0.4 μm-wide A1 interconnection. The signal charges transferred to the FD 85 modulate the voltage of the input gate 86. The MOS size of the input gate 86 is L=0 8 μm and W=1.0 μm. The sum of capacitances of the FD 85 and input gate 86 is about 5 fF. Since Q=CV, the voltage of the input gate 86 changes by 3.2 V by storing $10^5$ electrons.

A current flowing from a $V_{DD}$ terminal 91 is modulated by the input gate 86 and flowed to a vertical signal line 87. The current flowed to the vertical signal line 87 is processed by a signal processing circuit (not shown) and finally output as image information.

After this, to set the potential of the photodiodes 82*a* to 82*d*, FD 85, and input gate 86 to a predetermined value $V_{DD}$, the MOS gate 93 connected to the reset line 92 is opened (the transfer gates 83*a* to 83*d* are also opened), thereby short-circuiting the photodiodes 82*a* to 82*d*, FD 85, and input gate 86 to the $V_{DD}$ terminal.

After this, the transfer gates 83*a* to 83*d* are closed to restart charge storage by the photodiodes 82*a* to 82*d*.

Note that since interconnections 88*a* to 88*d*, 90, and 92 extending in the horizontal direction are formed from ITO (Indium Tin Oxide) with a thickness of 1,500 Å as a transparent conductor, light passes through the interconnection portions on the photodiodes 82*a* to 82*d*, and the center g of gravity of each photodiode matches the center of gravity of the area (light-receiving portion) for sensing light.

According to this example, a MOS sensor having an equal pitch and a relatively high area ratio and opening ratio can be provided.

Figure 22:
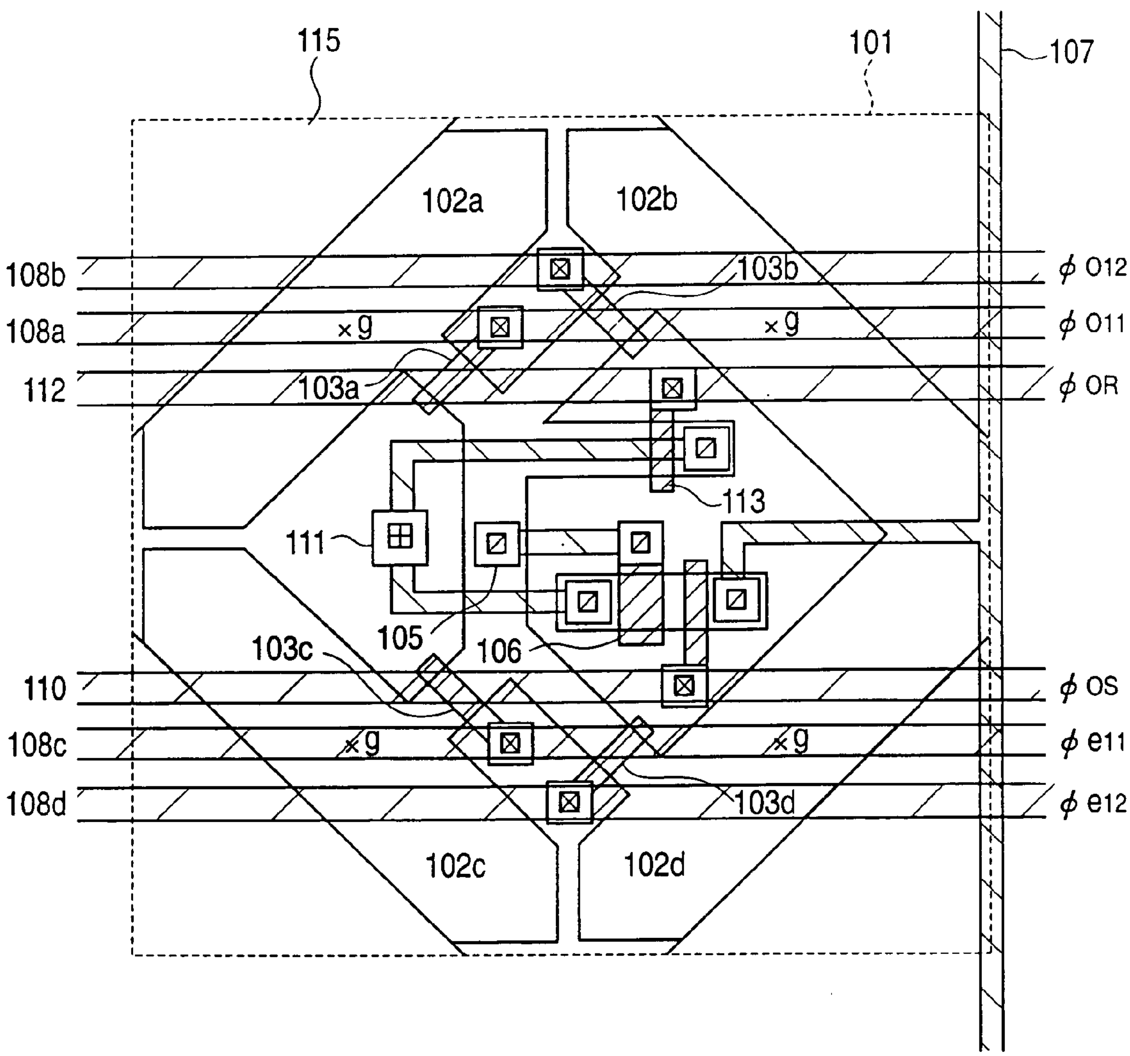
FIG. 22 is a view showing another pattern layout of the fifth embodiment.

FIG. 22 is a view showing the detailed pattern layout of the second example of the pixel array portion of the image pickup apparatus.

Referring to FIG. 22, the image pickup apparatus has photodiodes 102*a* to 102*d*, transfer gates 103*a* to 103*d*, a FD 105, an input gate 106 of a source follower, a vertical signal line 107, scanning lines 108*a* to 108*d*, a row selection line 110, and a reset line 112 for controlling a MOS gate 113.

In this example, three of the interconnections 108*a* to 108*d*, 110 and 112 run across the centers of the pixels in the horizontal direction. For this reason, even when the metal interconnections intercept light incident on the photodiodes 102*a* to 102*d*, the center g of gravity of the area for sensing light does not move and matches the center of each pixel.

According to this example, since an ordinary (opaque) metal with a small electrical resistance can be used, the time constants of interconnections in the horizontal direction improve, so a higher-speed image pickup apparatus can be provided.

Figure 23:
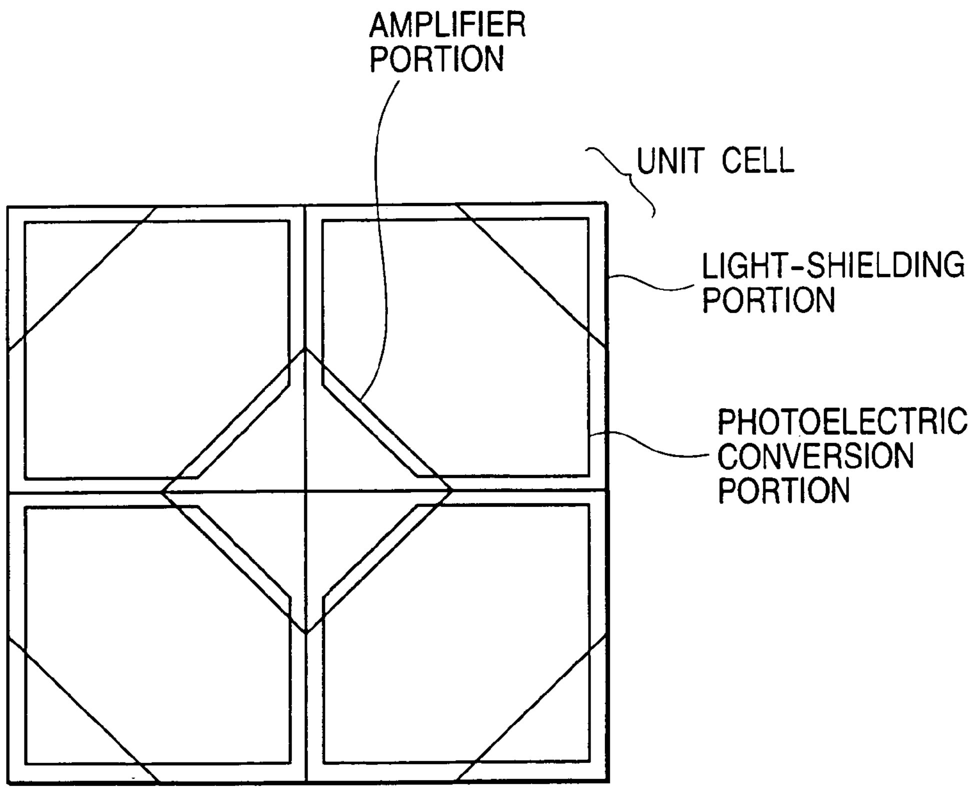
FIG. 23 is a view showing an example of the present invention.

In the above example, since the portion under the light-shielding film is effectively used, a photodiode serving as a photoelectric conversion portion may be formed even under the light-shielding film and functioned as a charge storage portion, as shown in FIG. 23.

Figure 24:
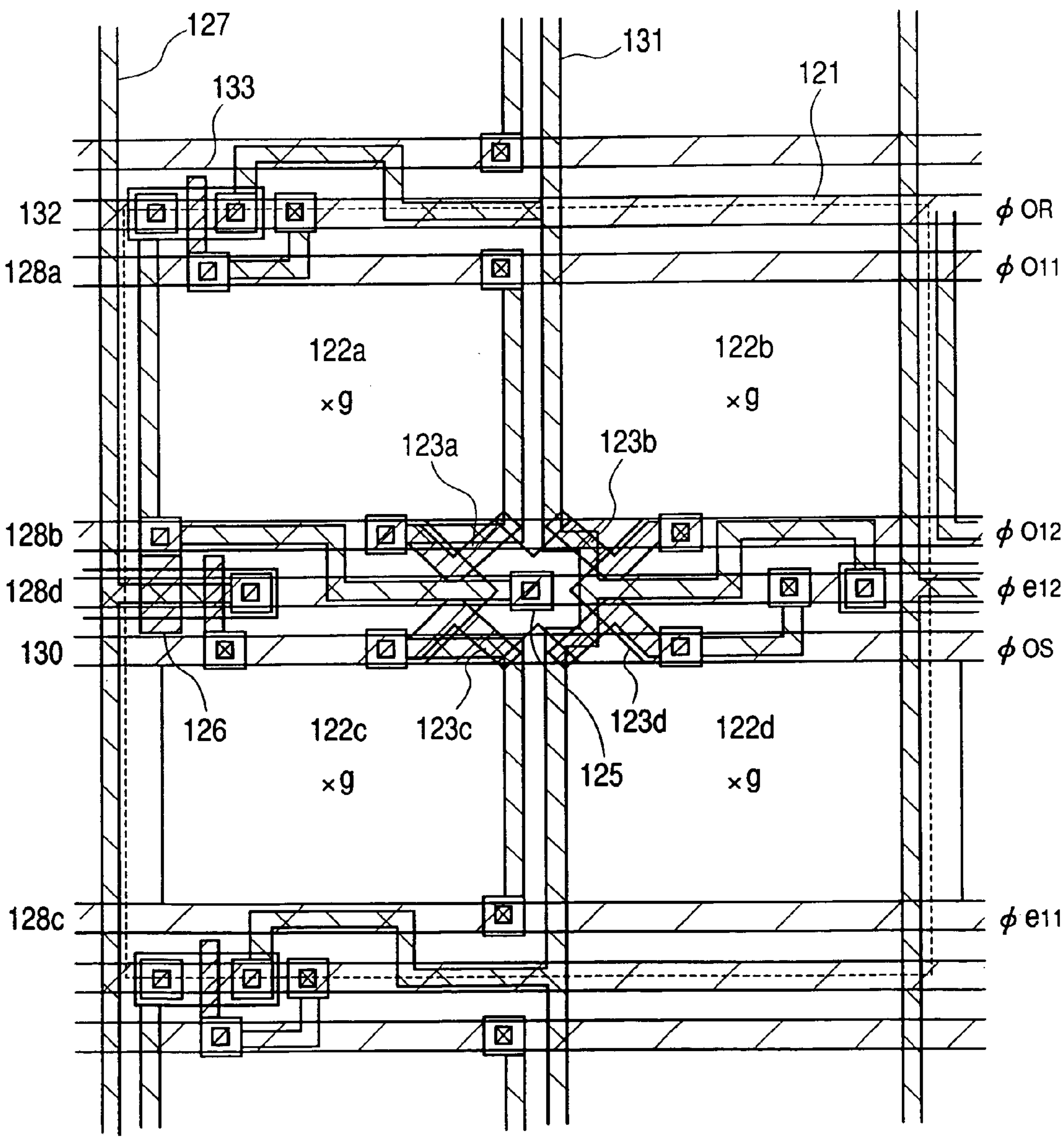
FIG. 24 is a view showing a pattern layout of the present invention.

In the second example, since the interconnections run across the center of each pixel with the highest light collection efficiency, the sensitivity of the image pickup apparatus may decrease. FIG. 24 shows a further improved third example.

In this example, since all of transfer gates 123*a* to 123*d*, an FD 125, an input gate 126 of a source follower, and a reset MOS gate 133 are formed under interconnections (scanning lines 128*a* to 128*d*, a row selection line 130, and a rest line 132) running in the horizontal direction, photodiodes 122*a* to 122*d* and their opening portions can be maximized. In addition, the opening portions are continuously present at the centers of the pixels. Light-shielding portions are formed in the horizontal and vertical interconnection portions.

In this example, since the source follower serving as the amplification means and the reset MOS transistor are divided in the horizontal direction around the pixels, they can be compactly layed out under the horizontal interconnections.

Furthermore, since an unused space still exists under the interconnections of the upper right pixel, a new component such as a smart sensor can be added.

According to this example, since the area and opening ratio of each photodiode can be made large, an image pickup apparatus with a wide dynamic range and high sensitivity can be provided. Even when the pixel size further shrinks, and the size of the opening portion of each photodiode becomes as small as the wavelength of light, light incidence is unlikely to be impeded, and the performance can be exhibited for a long time.

Figure 25:
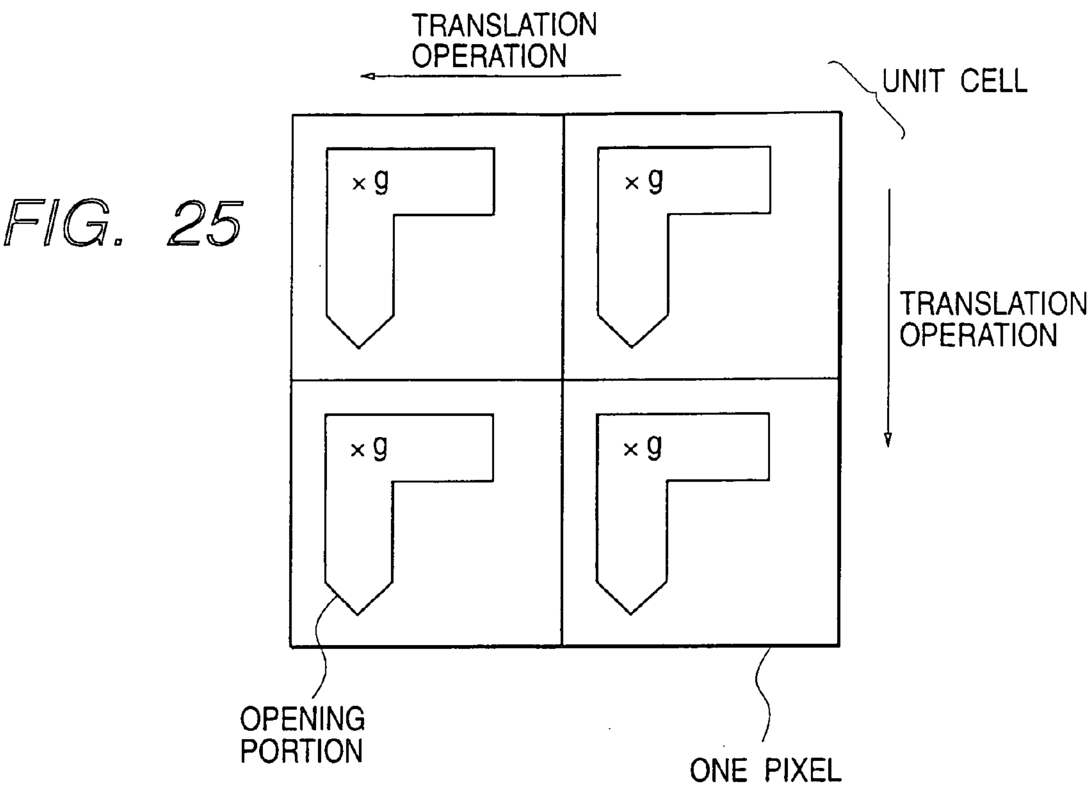
FIG. 25 is a view showing another example of the present invention.

In the above example, the amplification means is arranged at the central portion of the unit cell, and the center of gravity of the area for sensing light matches the center of the pixel. However, the present invention is not limited to this, and an arrangement in which the opening portions have a translationally symmetric shape may be used, as shown in FIG. 25.

That is, when the opening portions are translationally symmetric, the areas for sensing light are laid out at an equal pitch.

As has been described above, according to the first to fifth embodiments, a high opening ratio can be obtained by forming a plurality of photoelectric conversion portions per common amplifier. In addition, a high-quality image can be obtained even by interlaced driving. In low pixel count driving, a high-quality image with little moiré can be obtained at low power consumption as a pixel image to be recorded or displayed. Furthermore, the sensitivity increases to allow low-illuminance photographing.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image pickup apparatus comprising:

a plurality of unit cells arranged in an array, each unit cell including a plurality of photoelectric conversion portions and a common circuit for inputting signals from said plurality of photoelectric conversion portions and outputting the signals to the outside of said unit cell;

a first control portion for effecting control so that signals from a predetermined number (more than two) of photoelectric conversion portions for outputting signals of a same color are added at input portions of said common circuits included in said unit cells;

a common output line to which a plurality of signals from said plurality of unit cells are output sequentially; and a second control portion for effecting control so that the signals from a predetermined number (more than two) of photoelectric conversion portions for outputting signals of the same color are added outside of said unit cells and the added signals are output from said common output line.

2. An apparatus according to claim 1, wherein said common circuit comprises amplification means for amplifying the signals from said plurality of photoelectric conversion portions and outputting the signals.

3. An apparatus according to claim 1, wherein said second control portion adds the signals using horizontal transfer means.

4. An apparatus according to claim 1, further comprising read means for reading out signals from photoelectric conversion portions of two lines in a vertical direction by interlaced scanning.

5. An apparatus according to claim 1, further comprising a color filter arranged in said photoelectric conversion portions.

* * * * *

UNITED STATES PATENT AND TRADEMARK OFFICE

CERTIFICATE OF CORRECTION

PATENT NO. : 6,956,605 B1 Page 1 of 1
DATED : October 18, 2005
INVENTOR(S) : Seiji Hashimoto It is certified that error appears in the above-identified patent and that said Letters Patent is hereby corrected as shown below:

Column 4,
Line 27, “signals vertical” should read -- signals from vertical --; and
Line 28, “from” should be deleted.

Column 5,
Line 65, “add” should read -- added --.

Column 8,
Line 41, “($a_{11}$+$a_{21}$, $a_{12}$+$a_{22}$,…, lines” should read -- ($a_{11}$+$a_{21}$, $a_{12}$+$a_{22}$,…),…, lines --.

Column 13,
Line 14, “have” should read -- has --; and
Line 15, “generate” should read -- generates --.

Signed and Sealed this

Eleventh Day of April, 2006

JON W. DUDAS
*Director of the United States Patent and Trademark Office*